(12) United States Patent
Landry et al.

(10) Patent No.: US 8,446,170 B2
(45) Date of Patent: May 21, 2013

(54) FPGA RAM BLOCKS OPTIMIZED FOR USE AS REGISTER FILES

(75) Inventors: Joel Landry, Colorado Springs, CO (US); Jonathan Greene, Palo Alto, CA (US); William C. Plants, Campbell, CA (US); Wenyi Feng, Sunnyvale, CA (US)

(73) Assignee: Actel Corporation, San Jose, CA (US)

( * ) Notice: Subject to any disclaimer, the term of this patent is extended or adjusted under 35 U.S.C. 154(b) by 0 days.

(21) Appl. No.: 13/463,232

(22) Filed: May 3, 2012

(65) Prior Publication Data

US 2012/0280711 A1 Nov. 8, 2012

Related U.S. Application Data

(60) Provisional application No. 61/482,988, filed on May 5, 2011.

(51) Int. Cl.
*H03K 19/177* (2006.01)
(52) U.S. Cl.
USPC ................. 326/41; 326/47; 326/101
(58) Field of Classification Search .............. 326/37–41, 326/47, 101
See application file for complete search history.

(56) References Cited

U.S. PATENT DOCUMENTS

| | | | |
|---|---|---|---|
| 6,022,744 A * | 2/2000 | Tetteroo et al. | 435/410 |
| 6,317,367 B1 | 11/2001 | Sample et al. | |
| 6,340,897 B1 * | 1/2002 | Lytle et al. | 326/40 |
| RE39,510 E * | 3/2007 | Agrawal et al. | 326/40 |
| 7,190,190 B1 | 3/2007 | Camarota et al. | |
| 7,236,008 B1 | 6/2007 | Cliff et al. | |
| 7,626,861 B1 * | 12/2009 | Lakkapragada et al. | 365/185.08 |
| 2009/0045855 A1 | 2/2009 | Kuo et al. | |

OTHER PUBLICATIONS

Micron, Designing Applications with the x16 Burst A/D Multiplexed Interface, Nov. 2005, [Internet] URL: http://www.micron.com/products/dram/psram-cellularram, Micron Corporation, Boise, ID, 2 pages.
Notification of Transmittal of the International Search Report and Written Opinion mailed Aug. 7, 2012, International Search Report and Written Opinion in corresponding International Patent Application PCT/US2012/036493 filed May 4, 2012, 8 pages.

* cited by examiner

*Primary Examiner* — James H Cho
(74) *Attorney, Agent, or Firm* — Lewis and Roca LLP

(57) ABSTRACT

A random access memory circuit adapted for use in a field programmable gate array integrated circuit device is disclosed. The FPGA has a programmable array with logic modules and routing interconnects programmably coupleable to the logic modules and the RAM circuit. The RAM circuit has three ports: a first readable port, a second readable port, and a writeable port. The read ports may be programmably synchronous or asynchronous and have a programmably bypassable output pipeline register. The RAM circuit is especially well adapted for implementing register files. A novel interconnect method is also described.

5 Claims, 18 Drawing Sheets

FPGA RAM BLOCKS OPTIMIZED FOR USE AS REGISTER FILES

CROSS-REFERENCE TO RELATED APPLICATIONS

This application claims the benefit of U.S. Provisional Patent Application Ser. No. 61/482,988, filed May 5, 2011, the entirety of which is incorporated by reference herein.

BACKGROUND OF THE INVENTION

1. Field of the Invention

The present invention relates to Programmable Logic Devices (PLD) integrated circuit devices. In particular, the present invention relates to random access memory circuits for use in FPGA arrays.

2. The Prior Art

Programmable Logic Devices (PLDs) are known in the art. A PLD is an integrated circuit having a programmable logic core comprising uncommitted logic modules and routing interconnects that is able to implement an arbitrary end-user logic design up to the logic capacity of the device. PLDs come in a number of types with Field Programmable Gate Arrays (FPGAs) being the variety with the largest logic capacity and highest performance in commercially available devices, which typically makes them the flagship product lines of PLD manufacturers. Since high capacity and high performance typically result in them being used for the most challenging applications, the present invention is preferably applied to FPGAs, though the inventive principles herein apply to all classes of PLD.

An FPGA comprises circuitry to implement any number of initially uncommitted logic modules arranged in a programmable array along with an appropriate amount of initially uncommitted routing interconnects. Logic modules are circuits which can be configured to perform a variety of logic functions, for example, AND-gates, OR-gates, NAND-gates, NOR-gates, XOR-gates, XNOR-gates, inverters, multiplexers, adders, latches, and flip/flops. Routing interconnects can include a mix of components, for example, wires, switches, multiplexers, and buffers. Logic modules, routing interconnects, and other features, for example, user I/O buffers, PLLs, DLLs, and random access memory circuit blocks, are the programmable elements of the FPGA.

The programmable elements have associated control elements (sometimes known as programming bits or configuration bits) that determine their functionality. The control elements may be thought of as binary bits having values such as on/off, conductive/non-conductive, true/false, or logic-1/logic-0 depending on the context. Depending on the technology employed different numbers and types of circuit elements are used to create a control element. For example, to connect two circuit nodes an antifuse, a floating gate transistor, or an SRAM bit controlling a pass transistor may be used as one type of control element in their respective technologies. Or to create a programmable logic-0/logic-1 generator to control a logic circuit, programming one of two antifuses (one coupled to logic-0 and one coupled to logic-1), programming one of two floating gate transistors (one coupled to logic-0 and one coupled to logic-1), or a single SRAM bit, may be used as a second type of control element in their respective technologies. Other types of control elements are possible and the above examples are not limiting in any way.

The characteristics of the control elements vary according to the technology employed and their mode of data storage may be either volatile or non-volatile. Volatile control elements, for example, SRAM bits, lose their programming data when the FPGA power supply is disconnected, disabled or turned off. Non-volatile control elements, for example, antifuses and floating gate transistors, do not lose their programming data when the FPGA power supply is removed. Some control elements, such as antifuses, can be programmed only one time and cannot be erased. Other control elements, such as SRAM bits and floating gate transistors, can have their programming data erased and may be reprogrammed many times. The detailed circuit implementation of the logic modules and routing interconnects can vary greatly and is appropriate for the type of control element used.

The logic design programmed into an FPGA by the end user is typically implemented by use of a computer program product (also known as software or, more specifically, design software) produced by the PLD manufacturer and distributed by means of a computer-readable medium, for example, providing a CD-ROM to the end user or making the design software downloadable over the internet. Typically the manufacturer supplies a library of design elements as part of the computer program product. The library design elements include virtual programmable elements that provide a layer of insulation between the end user and the circuit details of the physical programmable elements of the FPGA. This makes the design software easier to use for the end user and simplifies the manufacturer's task of processing the end user's design by the various tools in the design software.

Typically, a user creates a logic design using the manufacturer-supplied design software by means of a schematic entry tool, a hardware description language such as Verilog or VHDL, importing it in some computer readable format, or some combination of the above. The design software then takes the completed design and converts it into the appropriate mix of logic-type virtual programmable elements, maps them into corresponding physical programmable elements inside the FPGA, virtually configures the routing interconnect-type programmable elements to route the signals from one logic-type programmable element to another, and generates the data structure necessary to assign values to the various physical control elements inside the FPGA. If a programming fixture is physically present on the design system, the data structure may be directly applied to program an FPGA. Alternatively, the data structure may be ported in a computer-readable medium to a dedicated programming system or into the end user's system for programming the FPGA at a later time.

Random Access Memory (RAM) blocks have been present in FPGA arrays by most PLD manufactures since the mid-1990s. A variety of inconsistent terminology has arisen surrounding them due to the inherent vagueness and inconsistent use of some engineering terms. Thus some precise definitions are needed for use in this specification.

A "port" is a set of memory block signal terminals that are programmably coupleable to the FPGA array routing interconnects and the associated memory block internal circuitry for performing operations. A port comprises in part a set of address input terminals (or address bus) for specifying particular storage locations in the memory block. A port may be readable, writeable, or both. A read-only port may read data from the addressed location but may not write data into that location. Thus it is readable but not writeable. A write-only port may write data into the addressed location but may not read data from that location. Thus it is writeable but not readable. A read-write port may both read data from the addressed location and write data into the addressed location. Thus it is both readable and writeable.

In addition to having a set of address input terminals, a port will also typically have a set of control input terminals. These will often include a variety of signals like, for example, a clock signal, one or more enable signals, operation select signals, mode select signals, etc., that can very considerably from one embodiment to another as a matter of design choice. Typically in an FPGA, some of these signals will be routed to the memory block through routing interconnects while others will be set by programmable logic-0/logic-1 generators which may be programmably coupled to the control input locations.

A port will also include a set of data signal terminals. A read-only port will have a set of data output terminals (or read data signals or read data bus), a write-only port will have a set of data input terminals (or write data signals or write data bus), and a read-write port will typically have both a set of write data input terminals and another set of read data output terminals. In theory, a read-write port could utilize a single set of bidirectional input/output terminals, but while this technique is used in some types of discrete memory chips to minimize pin count, it is not typically employed in an FPGA memory block.

The ports that have been discussed so far are user ports, meaning that they are used in an FPGA logic design in a manner similar to which any memory block would be used by someone of ordinary skill in the art by means of a logic design utilizing the FPGA routing interconnects to couple to the memory block. In FPGAs, alternate methods of accessing the contents of a RAM block are often present for initialization, programming, test, and potentially other purposes. These alternative methods of access are not considered ports in the context of the present invention.

One common example of such an alternate access method would be the configuration memory of an SRAM-based FPGA of the sort disclosed in U.S. Pat. No. 6,049,487 to Plants et al, in FIG. 4, FIG. 14 and FIG. 15. In FIG. 4 a memory block is shown having a "READ PORT", a "WRITE PORT" and a "LOAD PORT (READ/WRITE)". As described in conjunction with FIG. 14 and FIG. 15, each location in the memory block is also part of a larger configuration memory having many more rows and columns than the relatively small memory block and may be accessed as part of this memory by the mechanism described as a "LOAD PORT." This is not a user port (or simply "port") in the sense used in this specification because the address, data, and control signals of the "LOAD PORT" are not programmably coupled to the FPGA routing interconnects. The memory block of FIG. 4 is a two port SRAM with a read-only port and a write-only port as these terms are defined in this specification.

Ports may also be synchronous or asynchronous. A synchronous port responds to the arrival of the active edge of a clock input signal on its clock input control terminal according to the logic levels present on its other input terminals, while an asynchronous port responds only to the logic levels on its input terminals. Typically writeable ports are synchronous because of the complex timing that writing data into a RAM block entails and it would be difficult for an FPGA end user to try and coordinate a series of pulses and strobes of the sort shown in FIG. 9 of Plants. By moving the timing internal to the RAM writeable port, the user only needs to have the address, data and control signals make setup and hold time relative to a single clock edge, which in principle is no more complicated than making setup and hold time relative to a clock edge for a flip-flop.

Readable ports can be either synchronous or asynchronous. Typically large FPGA memory blocks are implemented synchronously because they employ sense amplifiers and thus also have fairly complicated internal timing. It is often easier to attain high memory block performance and generally more reliable to use a clock edge to start off the internal timing than to use techniques such as address transition detection (ATD) for large memory blocks. Smaller memory blocks often operate asynchronously because they often do not have sense amplifiers and the associated control and timing circuits.

FIG. 1A shows a "single port" prior-art FPGA memory block, generally indicated by reference number 100. In FIG. 1A, single port RAM block 102 is shown coupled to CONTROL bus 104, WRITE_DATA bus 106, ADDRESS bus 108, and a READ_DATA bus 110. Busses 104, 106, 108 and 110 together, along with the reading and writing circuitry internal to single port RAM block 102, comprise the single port. By necessity, this is a read-write port since a RAM block with just a write-only port is not particularly useful (unless there is some alternative way to read it) and a RAM block with just a read-only port behaves more like a read-only memory (ROM) than a RAM (assuming there is some alternative way to write it).

FIG. 1B shows a "two port" FPGA memory block of the prior art, generally indicated by reference number 120. In the figure, two port RAM block 122 is shown having a write-only port 130 and a read-only port 140. Coupled to write port 130 is WRITE_CONTROL bus 132, WRITE_DATA bus 134, and WRITE_ADDRESS bus 136. Coupled to read port 140 is READ_CONTROL bus 142, READ_ADDRESS bus 144, and READ_DATA bus 146. Busses 132, 134 and 136 together, along with the writing circuitry internal to Two Port RAM block 122, comprise the write-only port 130. Busses 142, 144 and 146 together, along with the reading circuitry internal to two port RAM block 122, comprise the read-only port 140.

FIG. 1C shows a "dual port" FPGA memory block of the prior art, generally indicated by reference number 150. In the figure, dual port RAM block 152 is shown having a read-write port "A" 160 and a read-write port "B" 170. Coupled to read-write port A 160 is CONTROL_A bus 162, WRITE_DATA_A bus 164, ADDRESS_A bus 166, and READ_DATA_A bus 168. Coupled to read-write port B 170 is CONTROL_B bus 172, WRITE_DATA_B bus 174, ADDRESS_B bus 176, and READ_DATA_B bus 178. Busses 162, 164, 166 and 168 together, along with their associated reading and writing circuitry internal to dual port RAM block 152, comprise read-write port A 160. Busses 172, 174, 176 and 178 together, along with their associated reading and writing circuitry internal to dual port RAM block 152, comprise read-write port B 170.

For purposes of this specification, a dual port memory has two read-write ports while a two ported memory has some other combination of port types. The distinction needs to be made because in the early days of FPGA memory blocks, two port RAM blocks were common but were typically marketed as dual port RAM blocks. Later, when memories with two read-write ports became common, they were typically marketed as "true dual port" RAM blocks in order to contrast them from the earlier (and arguably mislabeled) two ported memory blocks.

Xilinx, Inc., of San Jose, Calif. introduced distributed SRAM blocks in some of their 4000 series FPGA product families. This allowed the standard 4-input lookup table logic modules to be used as 16-bit memory blocks. A single logic module could be used as a single ported 16×1 SRAM or combined with a neighboring logic module to produce a 16×2 or 32×1 single ported SRAM. Two logic modules could also be combined to produce a 16×1 two ported SRAM with one read-write port and one read-only port. The single port SRAM options could be synchronous or asynchronous while the two port SRAM options were synchronous.

Altera Corp., of San Jose, Calif. introduced Embedded Array Blocks (EAB) in their FLEX 10K embedded programmable logic family devices. The EAB was a 2,048-bit (or 2 Kb or simply 2K) single ported SRAM block which could be configured as 256×8, 512×4, 1K×2 and 2K×1. It was capable of both synchronous and asynchronous operation.

Actel Corp., of Mountain View, Calif. introduced the 3200 DX family of FPGAs which included a 256-bit two port SRAM block which could be configured as 32×8 or 64×4. It had a synchronous write-only port and a read-only port which could be programmed to either be synchronous or asynchronous.

After the early attempts, most PLD manufacturers eventually settled on synchronous dual port SRAM blocks in their FPGA families. A typical example is the BlockSelectRAM+ memory blocks in the first Virtex FPGA family by Xilinx. These were 4,096-bit dual port SRAM blocks with each port independently configurable as 256×16, 512×8, 1K×4, 2K×2 and 4K×1. Each port was synchronous and independently configurable as to width and depth.

Different approaches to timing synchronous ports were also tried. In U.S. Pat. No. 6,049,487, a 2,048-bit two port SRAM with a synchronous write-only port and programmably synchronous or asynchronous read-only port was disclosed. In the text associated with FIG. 5, FIG. 11 and FIG. 12, the internal workings of the memory block were described as being asynchronous and using an ATD circuit to time the sense amplifiers. When combined with appropriately timing the clock signal to the latches 74 in series with the read address input terminals 72 in FIG. 5, it created the effect of a pseudo D-type flip-flop with variable timing. This allowed an end user to make the SRAM block behave like a flip-flop with the ability to swap setup time in one clock cycle for clock-to-data-out time in the next by varying the relative timing of the read address signals relative to the read clock signal.

In the Axcelerator family of FPGAs, Actel introduced the output pipeline register. The Axcelerator family had a 4,096-bit two port memory block with a synchronous write-only port and a synchronous read-only port, each port independently configurable as 128×36, 256×18, 512×9, 1K×4, 2K×2 and 1K×1. The AX SRAM block included a register with each output terminal on the read data bus. The register could be programmably placed in series with the read data or it could be bypassed with a multiplexer. The effect of the register was to give the end user the option of having a read port with a two clock cycle latency or the typical one clock cycle latency of other synchronous readable ports. This allowed the end user to place the entire memory function in a single pipeline stage to increase performance if desired.

In subsequent generations of FPGAs, Altera has gone to multiple sizes of memory blocks with their TriMatrix memory scheme. For example, the original Stratix FPGA family and the later Stratix IV FPGA family each have two different sizes of dual ported memory blocks in their FPGA arrays, with the third memory (the "Tri" in "TriMatrix") being the use of a LAB (Altera parlance for a cluster of SRAM-based lookup table logic modules) as a memory block. This approach is described in detail in U.S. Pat. No. 7,236,008 to Cliff, et al.

In recent years, soft processors have become increasingly important FPGA applications. A soft processor is a CPU or microcontroller implemented using FPGA array logical and routing interconnects. Typically, processors perform operations on the contents of temporary storage registers internal to the processor. These registers are typically part of a data structure known as a register file. Each register has a unique address inside the register file which the processor uses to access its contents.

In many common processor operations, the contents of two different registers are accessed as operands, a logic or arithmetic function is performed on the two operands, and the results of the operation are then stored back in the register file—either in one of the two registers containing the original operands or in a third register. Typically both operands are read at the same time that a result from a previous operation is written. Thus it is very common to be simultaneously reading two registers while performing a simultaneous write.

It is difficult to construct register files for soft processors in FPGAs of the prior art. Building them out of logic modules can be very costly in terms of FPGA resources. For example, a 32×32 (32 words each having 32 data bits) will require 1,024 individual flip-flops plus additional logic to construct. Thus a memory block is typically used. Unfortunately, conventional FPGA memory blocks are poorly suited to use as register files for several reasons. First, they are usually larger than necessary. It is inefficient to build a 32×32=1 Kb register file using a 4 Kb, 8 Kb, or 16 Kb memory block. Second, they are usually synchronous which limits flexibility in optimizing critical paths into and out of the register file since there is no control over the location of the pipeline registers before or after it. Third, they do not support three ports which results in complex logic being required to compensate. Alternatively, two dual or two port memory blocks are used. This involves simultaneously controlling a writeable port on each block and using the other readable port on each as one of the two readable ports for the register file. This is also an inefficient use of FPGA resources.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

A three port random access memory circuit block that may be adapted for use in a FPGA array for register file applications is disclosed. The memory block preferably comprises two read-only ports and a write-only port to minimize the area of the circuitry and the number of terminals, though any RAM circuit block with two readable ports and a third writeable port falls within the scope of the invention like, for example, a triple ported RAM with three read-write ports. The writeable port is preferably synchronous, though this is not required. The two readable ports are preferably programmable to be either asynchronous or synchronous, with a number of different timing options programmably available to increase flexibility for the end user. Because of the high number of input and output terminals, a number of techniques for interfacing the RAM to routing interconnects in the FPGA array are also disclosed.

Figure 1A:
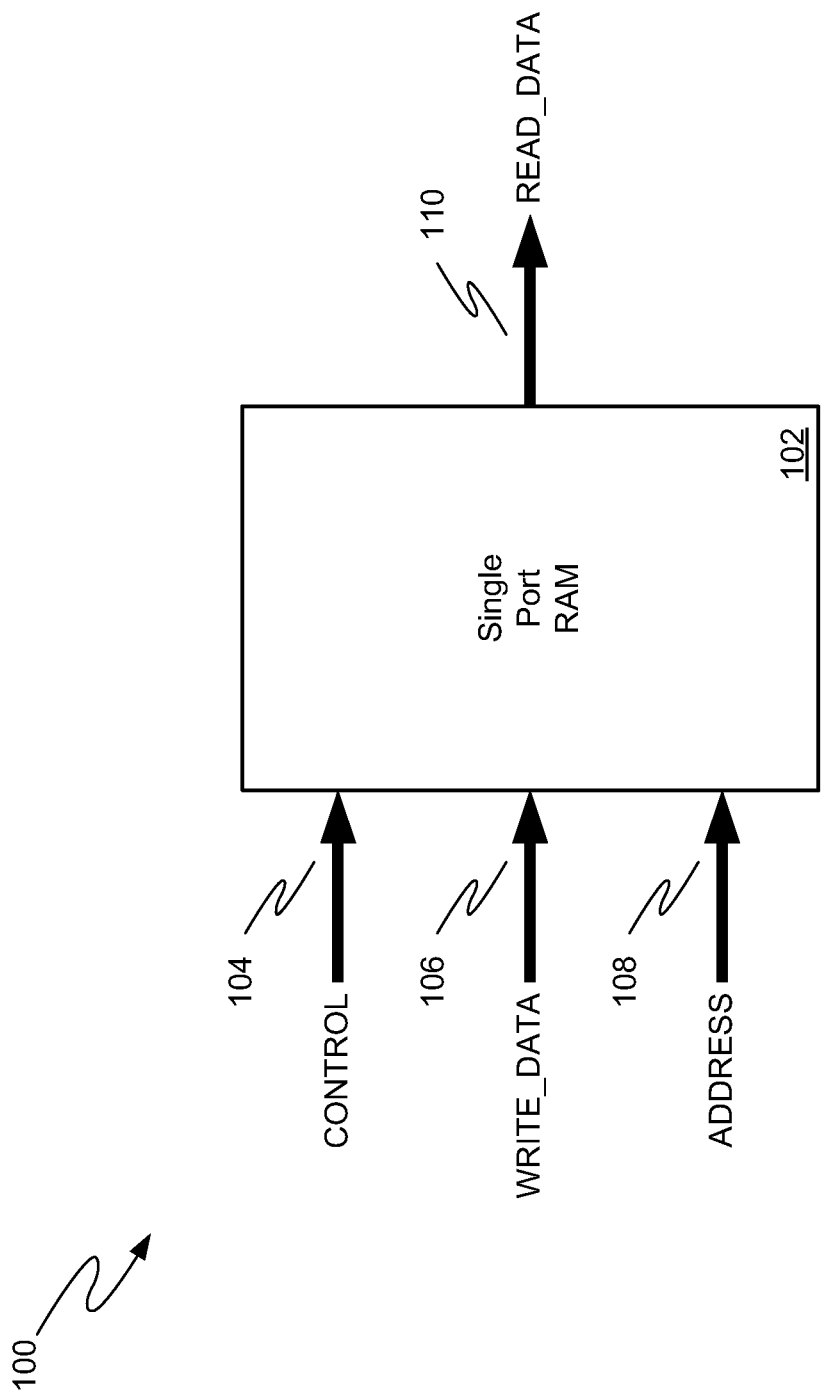
FIG. 1A is a block diagram showing a single port FPGA memory block of the prior art.
Figure 1B:
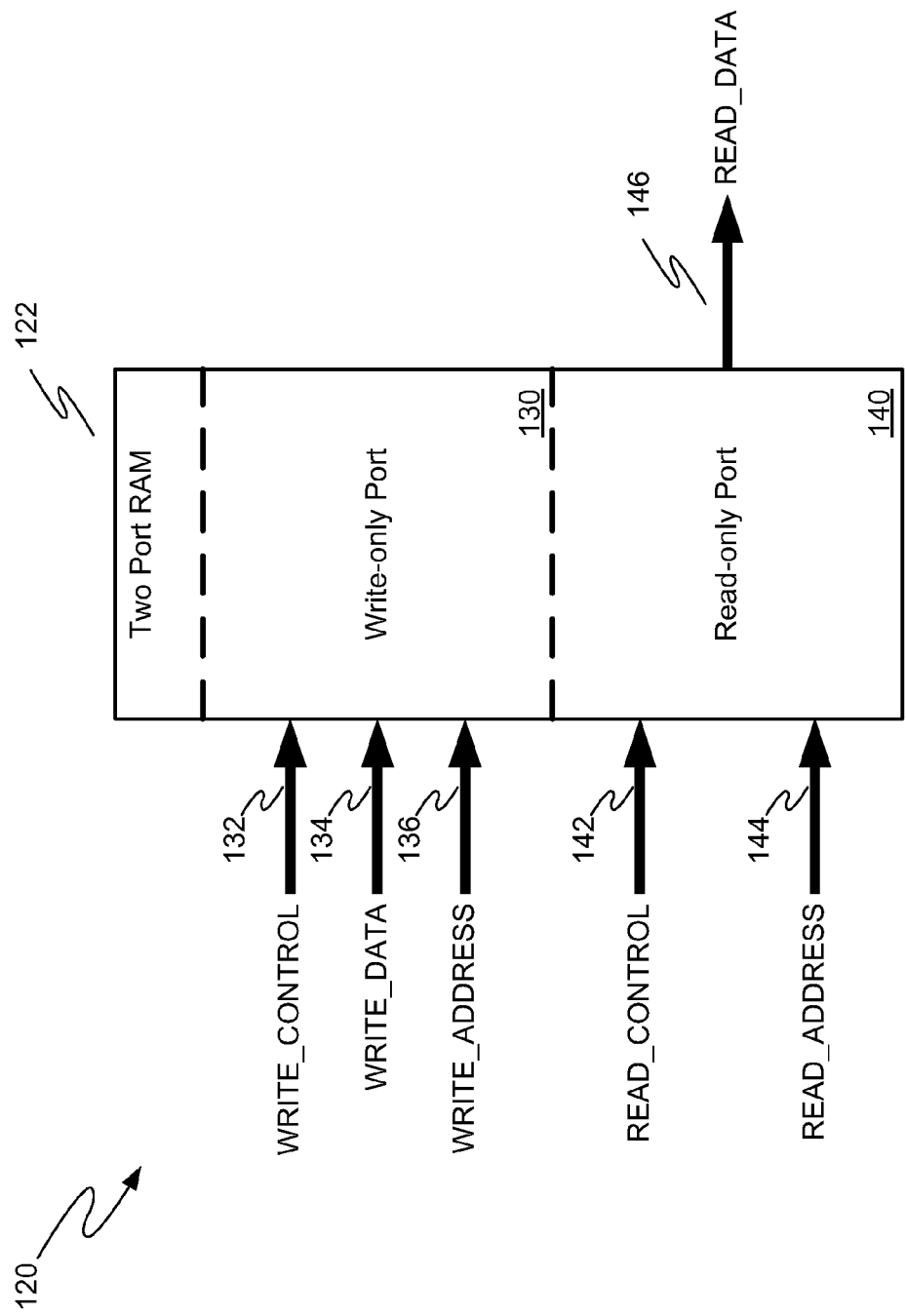
FIG. 1B is a block diagram showing a two port FPGA memory block of the prior art.
Figure 1C:
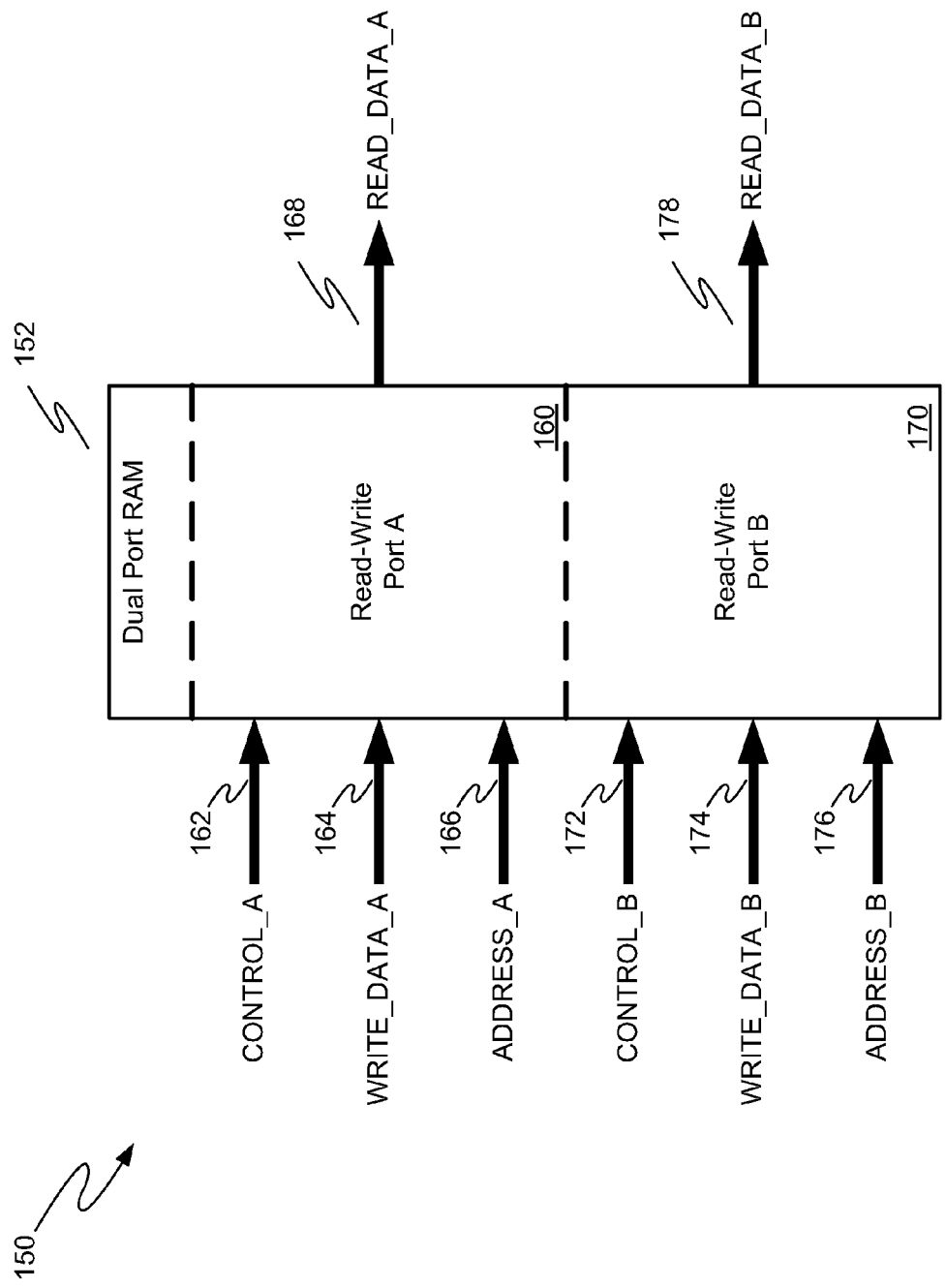
FIG. 1C is a block diagram showing a dual port FPGA memory block of the prior art.
Figure 2:
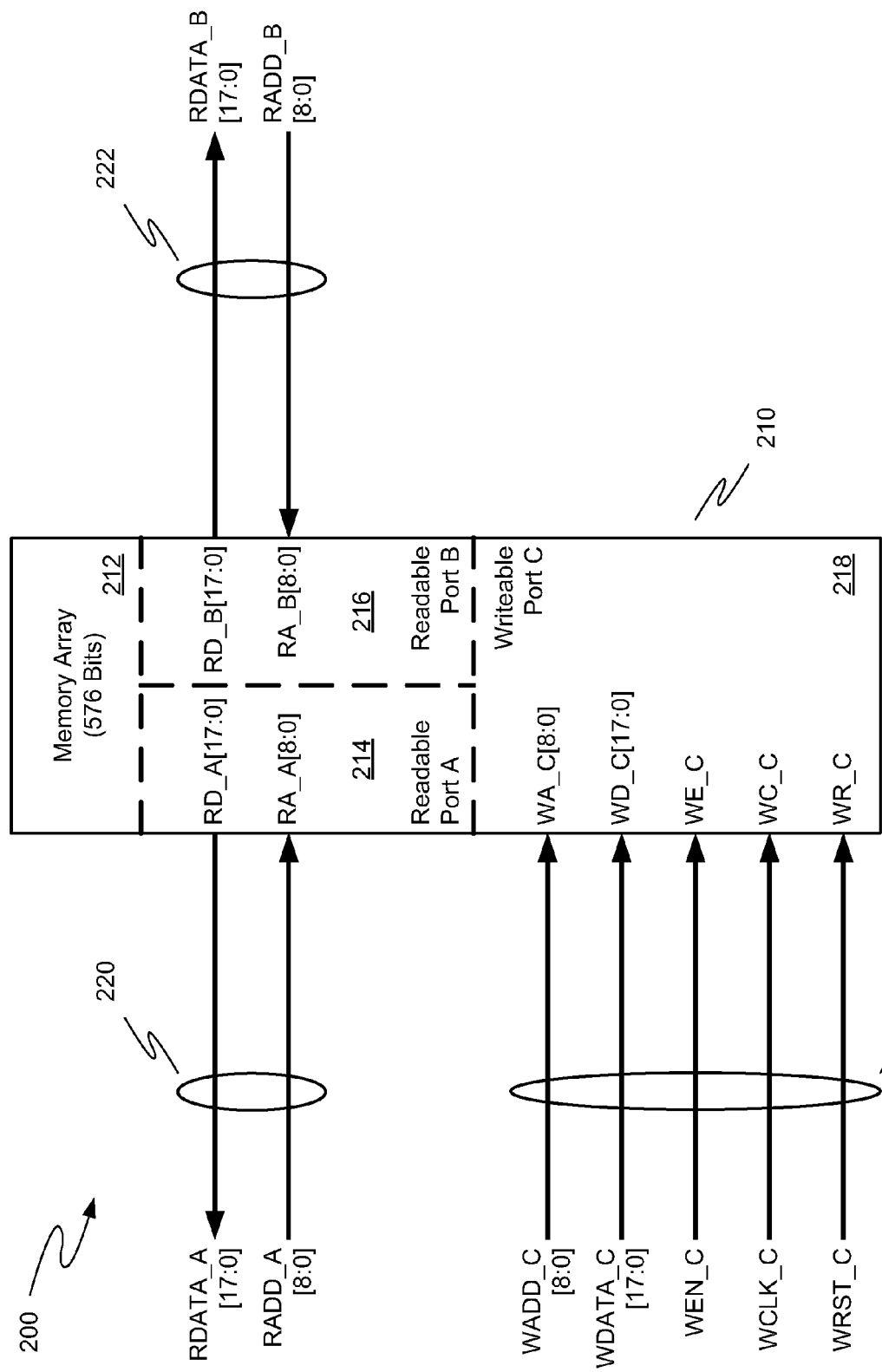
FIG. 2 is a block diagram showing a first exemplary random access memory circuit block according to the present invention.

FIG. 2 shows a first RAM circuit block 200 and its associated terminals according to the present invention. The RAM block 200 comprises a three ported RAM circuit block 210 having a 576-bit memory array 212, a first asynchronously readable port 214 (the "A" port), a second asynchronously readable port 216 (the "B" port) and a synchronously writeable port 218 (the "C" port). All three ports 214, 216 and 218 are internally coupled to memory array 212 in a manner such that each can carry out its allowed operations on the memory bits inside memory array 212. The internal circuitry of RAM circuit block 210 may be of any type known in the art. For example, the memory array may be implemented with discrete flip-flops or as a physical array of RAM-like latched memory cells, or sense amplifiers (with or without address transition detection) may be employed, or the memory cells can output full logic levels without any special sensing circuitry, etc. The implementation details of RAM circuit block 210 are a matter of design choice and in no way limit the present invention.

Each of the ports 214, 216 and 218 can be independently programmed to operate in one of five different modes: 32×18, 64×9, 128×4, 256×2 and 512×1. All combinations of the modes are possible giving 5×5×5=125 possible configurations. Addressing and data packing of the words is done in "little-endian" format to simplify accessing data with different ports having different word widths. While register files will typically use the same word width for all three ports, end users frequently use FPGA features in ways unanticipated by the PLD manufacturer. Thus it is highly desirable to provide the general flexibility to the end user to utilize the RAM circuit block 200 in all possible combinations of the available word width and depth modes without restriction.

A port in either 32×18 or 64×9 mode has access to a ninth bit in each byte of the data word. These ninth bits are not accessible by a ports in the 128×4, 256×2 and 512×1 modes. The port modes are selected in response to the logic values on control signals (not shown in FIG. 2) that may be generated by 0/1 control elements associated with each signal.

The "internal" terminals on memory block 210 are coupled to "external" terminals for memory block 200. The A port internal terminals RD_A[17:0] and RA_A[8:0] are coupled to the external terminals RDATA_A[17:0] and RADD_A[8:0] respectively through a first group of wires 220. The B port internal terminals RD_B[17:0] and RA_B[8:0] are coupled to the external terminals RDATA_B[17:0] and RADD_B[8:0] respectively through a second group of wires 222. The C port internal terminals WD_C[17:0], WA_C[8:0], WE_C, WC_C and WR_C are coupled to the external terminals WADD_C[8:0], WDATA_C[17:0], WEN_C, WCLK_C and WRST_C respectively through a third group of wires 224. This distinction is important in other embodiments where circuitry is coupled between the "internal" terminals of RAM block 210 and the "external" terminals of a more fully featured RAM circuit block of that particular embodiment.

Readable port A 214 is an asynchronous read-only port of RAM block 210. RA_A[8:0] is a 9-bit read address input terminal. (The nine individual signal read address terminals are named RA_A[8], RA_A[7], etc., to RA_A[0]. The notation of two integers in square brackets separated by a colon refers to a range of indices appended to the signal name in square brackets from the first integer to the second, inclusive.) RD_A[17:0] is an 18-bit read data output terminal. Because the port is asynchronous, the data on RD_A[17:0] responds to changes on RA_A[8:0]. The delay between when an address stabilizes on RA_A[8:0] and the data stored in that address appears on RD_A[17:0] is known as the read access time for port A 216. No other clock or timing signal is necessary for reading.

Readable port B 216 is an asynchronous read-only port of RAM block 210. RA_B[8:0] is a 9-bit read address input terminal. RD_B[17:0] is an 18-bit read data output terminal. Because the port is asynchronous, the data on RD_B[17:0] responds to changes on RA_B[8:0]. The delay between when an address stabilizes on RA_B[8:0] and the data stored in that address appears on RD_B[17:0] is known as the read access time for port B 216. No other clock or timing signal is necessary for reading.

Writeable port C 218 is a synchronous write-only port of RAM block 210. WA_C[8:0] is a 9-bit write address input terminal. WD_C[17:0] is an 18-bit write data input terminal. WE_C is a write enable control input terminal. WC_C is a write clock enable control terminal. WR_C is a reset control terminal. The wires coupled to WE_C, WC_C and WR_C in group of wires 224 are shown as standard width lines with small arrowheads (indicating direction of signal flow) in FIG. 2 to indicate they are individual signals, while the wires coupled to other terminals in groups 220, 222 and 224 are shown as heavy lines with large arrowheads to indicate they comprise multiple signals. This convention is used throughout the drawing figures in this application.

WR_C is preferably an asynchronous reset signal for port C 218. When asserted it forces all of the sequential elements in writeable port C into a known safe state. This can prevent unexpected errors on the first write operation after a power up from occurring. In some embodiments, WR_C can also be used to clear all of the memory cells in memory array 212. All of the other signals, the write address WA_C[8:0], the write data WD_C[17:0] and the write enable WE_C, must meet setup and hold time relative to the active edge of write clock WC_C in order for the port to work correctly. If WE_C is asserted on the active edge of WC_C, then the data present on WD_C[17:0] will be written into the memory location addressed by WA_C[8:0]. If WE_C is deasserted on the active edge of WC_C, then no write operation occurs.

Figure 3:
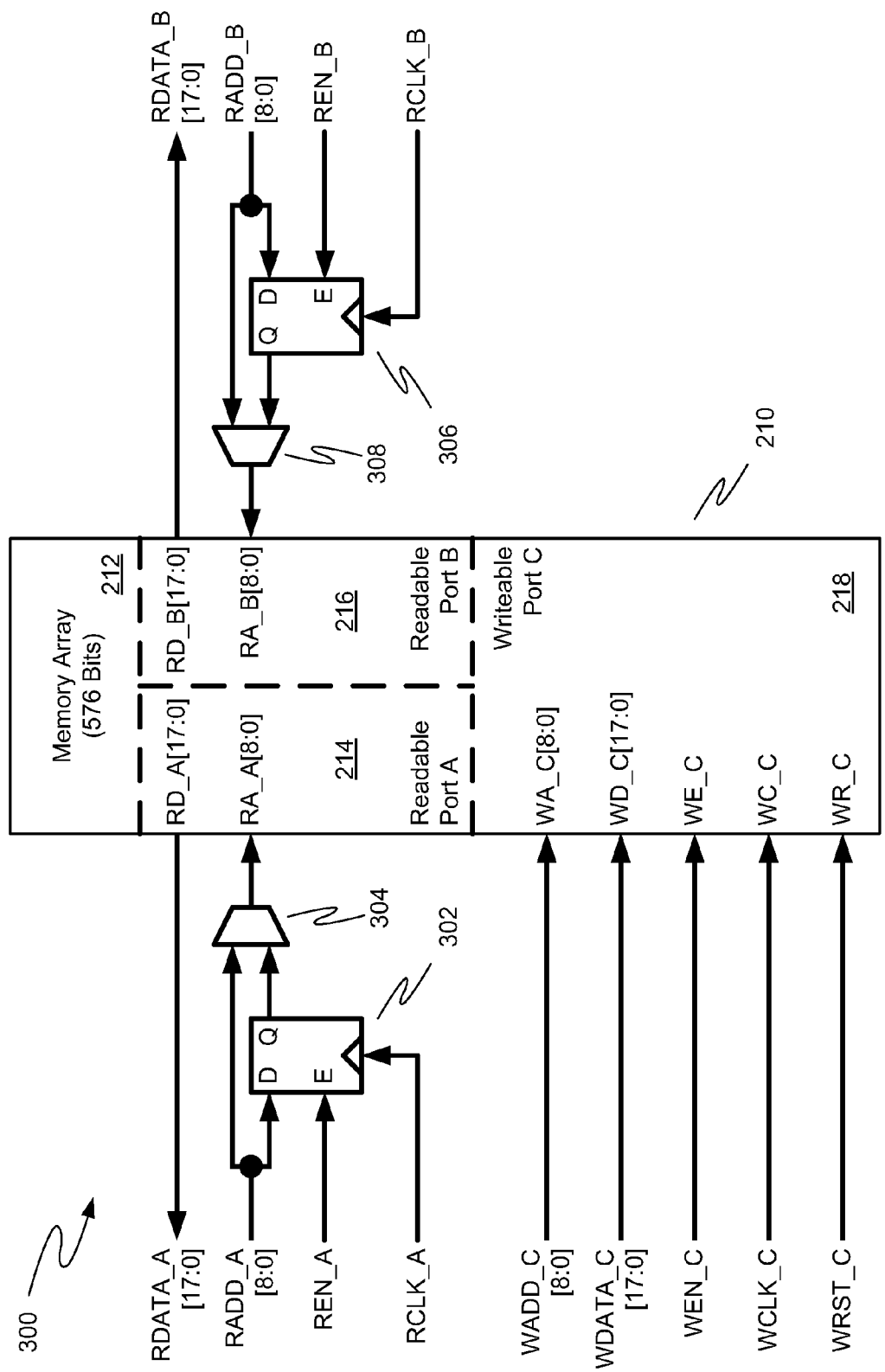
FIG. 3 is a block diagram showing a second exemplary random access memory circuit block according to the present invention.

FIG. 3 shows a second RAM circuit block 300 and its associated terminals according to the present invention. Present in FIG. 3 are three port RAM circuit block 210 and external terminals RDATA_A[17:0], RADD_A[8:0], RDATA_B[17:0], RADD_B[8:0], WADD_C[8:0], WDATA_C[17:0], WEN_C, WCLK_C and WRST_C previously discussed in conjunction with FIG. 2. Also present are a plurality of flip-flops 302, a plurality of multiplexers 304, a plurality of flip-flops 306, a plurality of multiplexers 308, and terminals REN_A, RCLK_A, REN_B, and RCLK_B.

There are nine flip-flops in plurality of flip-flops 302. Each has a data input coupled to one of the individual signal input terminals of bus RADD_A[8:0] of RAM circuit block 300, a data output coupled to a first data input of one of the multiplexers of plurality of multiplexers 304, a clock input coupled to control input terminal RCLK_A of RAM circuit block 300, and an enable input coupled to control input terminal REN_A of RAM circuit block 300.

There are nine multiplexers in plurality of multiplexers 304. Each has a second data input coupled to one of the individual signal input terminals of bus RADD_A[8:0] of RAM circuit block 300 and an output coupled to one of the individual signal input terminals of bus RA_A[8:0] of RAM circuit block 210. All of the multiplexers in plurality of multiplexers 304 are programmably controlled together by a first control element or first group of control elements (not shown in FIG. 3) so that all of them together pass all of the RADD_A [8:0] signals to RA_A[8:0] or all of them together pass all of the plurality of flip-flop 302 output signals to RA_A[8:0]. This configuration with plurality of multiplexers 304 makes the plurality of flip-flops 302 programmably bypassable as specified by the end user, since signals in the RADD_A bus can be programmed to pass directly to the RA_A bypassing the flip-flops 302 or programmed to be held at the flip-flops 302 until the next active edge of RCLK_A.

There are nine flip-flops in plurality of flip-flops 306. Each has a data input coupled to one of the individual signal input terminals of bus RADD_B[8:0] of RAM circuit block 300, a data output coupled to a first data input of one of the multiplexers of plurality of multiplexers 308, a clock input coupled to control input terminal RCLK_B of RAM circuit block 300, and an enable input coupled to control input terminal REN_B of RAM circuit block 300.

There are nine multiplexers in plurality of multiplexers 308. Each has a second data input coupled to one of the individual signal input terminals of bus RADD_B[8:0] of RAM circuit block 300 and an output coupled to one of the individual signal input terminals of bus RA_B[8:0] of RAM circuit block 210. All of the multiplexers in plurality of multiplexers 304 are programmably controlled together by a first control element or first group of control elements (not shown in FIG. 3) so that all of them together pass all of the RADD_B [8:0] signals to RA_B[8:0] or all of them together pass all of the plurality of flip-flop 302 output signals to RA_A[8:0]. This configuration with plurality of multiplexers 308 makes the plurality of flip-flops 306 programmably bypassable as specified by the end user, since signals in the RADD_B bus can be programmed to pass directly to the RA_B bypassing the flip-flops 306 or programmed to be held at the flip-flops 306 until the next active edge of RCLK_B.

The pluralities of flip-flops 302 and 306 and multiplexers 304 and 308 to RAM circuit block 300 make the two read-only ports programmably either synchronous or asynchronous as specified by the end user design. Thus the end user has the option of registering the address immediately before performing a memory read by either port A 214 or port B 216 or both, or generating the address using logic directly prior to presenting it to the RA_A[8:0] or RA_B[8:0] input terminals. This provides the end user with a higher degree of flexibility in optimizing the critical paths leading into and out of the register file in his soft processor. In synchronous mode, RADD_A[8:0] and RADD_B[8:0] must make setup and hold time relative to the active edge of RCLK_A and RCLK_B respectively.

The REN_A and REN_B signals are used to enable the pluralities of flip-flops 302 and 306 respectively. REN_A and REN_B must make setup and hold time relative to the active edge of RCLK_A and RCLK_B respectively. When either enable is asserted, its associated flip-flops will allow data presented on the data inputs to be transmitted to the data outputs on the rising edge of the associated clock. When either enable is deasserted, its associated flip-flops will not allow data presented on the data inputs to be transmitted to the data outputs on the rising edge of the associated clock and will hold the previously stored data instead.

Writeable port C 218 behaves the same in RAM circuit block 300 as it did in RAM circuit block 200.

Other modifications to readable port A and readable port B of RAM circuit block 300 will suggest themselves to persons of ordinary skill in the art. For example, the functionality of the pluralities of flip-flops 302 and 306 could be modified to match that of any of a number of flip-flops known in the art, for example, by removing the enable inputs, adding either an asynchronous set or reset inputs, adding either a synchronous set or reset inputs, etc. Or the flip-flops can be programmed to be either a latch or a flip-flop as is often done with FPGA flip-flop logic modules known in the art. These and other such changes are within the scope of the present invention.

Figure 4:
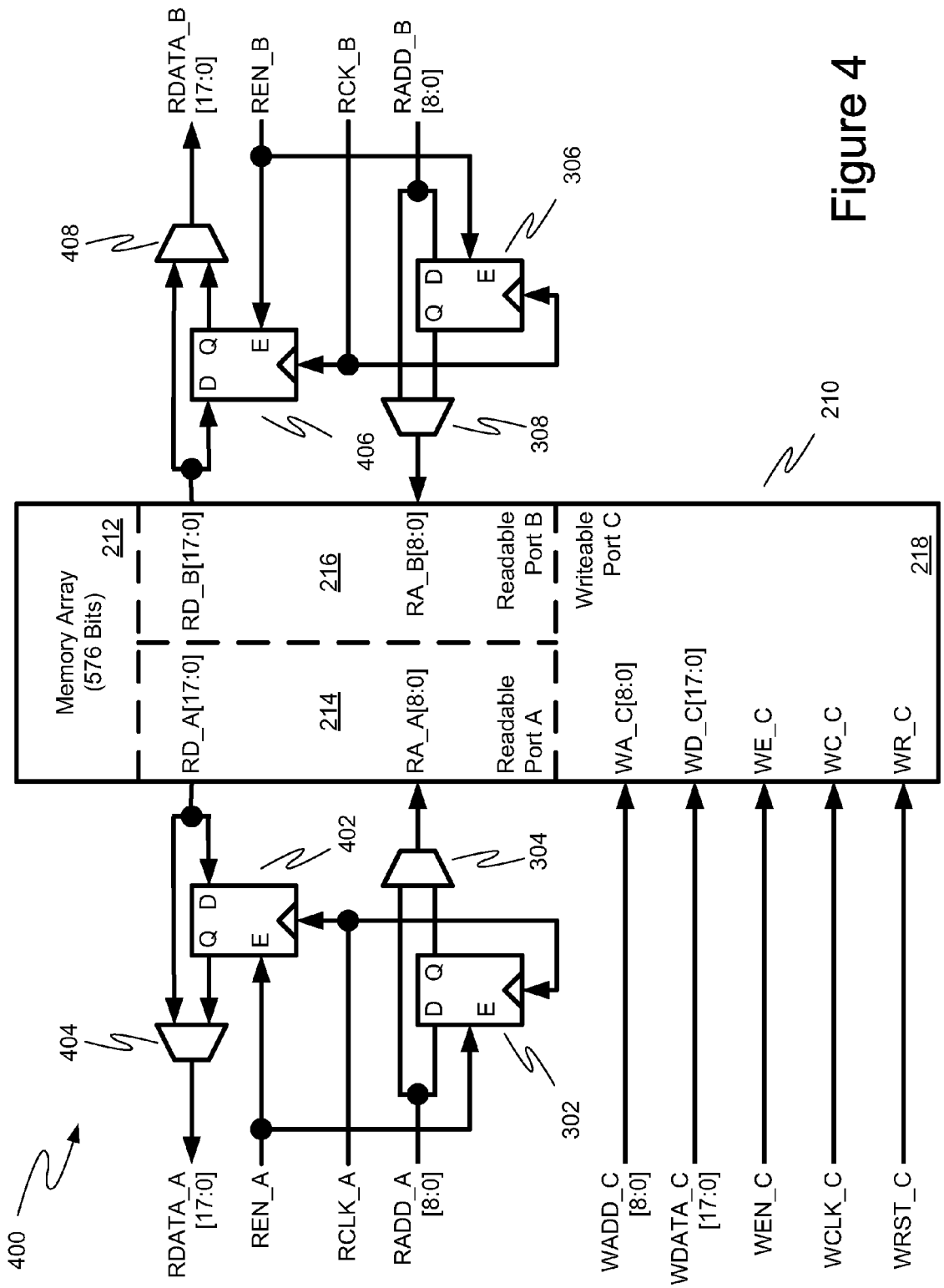
FIG. 4 is a block diagram showing a third exemplary random access memory circuit block according to the present invention.

FIG. 4 shows a third RAM circuit block 400 and its associated terminals according to the present invention. Present in FIG. 4 are three port RAM circuit block 210, pluralities of flip-flops 302 and 306, pluralities of multiplexers 304 and 308, and external terminals RDATA_A[17:0], RADD_A[8:0], REN_A, RCLK_A, RDATA_B[17:0], RADD_B[8:0], REN_B, RCLK_B, WADD_C[8:0], WDATA_C[17:0], WEN_C, WCLK_C and WRST_C previously discussed in conjunction with FIG. 2 and FIG. 3. Also present are a plurality of flip-flops 402, a plurality of multiplexers 404, a plurality of flip-flops 406, and a plurality of multiplexers 408.

There are eighteen flip-flops in plurality of flip-flops 402. Each has a data input coupled to one of the individual signal output terminals of bus RD_A[17:0] of RAM circuit block 210, a data output coupled to a first data input of one of the multiplexers of plurality of multiplexers 404, a clock input coupled to control input terminal RCLK_A of RAM circuit block 400, and an enable input coupled to control input terminal REN_A of RAM circuit block 400.

There are eighteen multiplexers in plurality of multiplexers 404. Each has a second data input coupled to one of the individual signal output terminals of bus RD_A[17:0] of RAM circuit block 210 and an output coupled to one of the individual signal output terminals in bus RDATA_A[17:0] of RAM circuit block 400. All of the multiplexers in plurality of multiplexers 404 are programmably controlled together by a first control element or first group of control elements (not shown in FIG. 4) so that all of them together pass all of the RD_A[17:0] signals to RDATA_A[17:0] or all of them together pass all of the plurality of flip-flops 402 output signals to RDATA_A[17:0]. This configuration with plurality of multiplexers 404 makes the plurality of flip-flops 402 programmably bypassable as specified by the end user, since signals in the RD_A bus can be programmed to pass directly to the read data output terminals in the RDATA_A bus bypassing the flip-flops 402 or programmed to be held at the flip-flops 402 until the next active edge of RCLK_A.

There are eighteen flip-flops in plurality of flip-flops 406. Each has a data input coupled to one of the individual signal output terminals of bus RD_B[17:0] of RAM circuit block 210, a data output coupled to a first data input of one of the multiplexers of plurality of multiplexers 408, a clock input coupled to control input terminal RCLK_A of RAM circuit block 400, and an enable input coupled to control input terminal REN_A of RAM circuit block 400.

There are eighteen multiplexers in plurality of multiplexers 408. Each has a second data input coupled to one of the individual signal output terminals of bus RD_B[17:0] of RAM circuit block 210 and an output coupled to one of the individual signal output terminals of bus RDATA_B[17:0] of RAM circuit block 400. All of the multiplexers in plurality of multiplexers 408 are programmably controlled together by a first control element or first group of control elements (not shown in FIG. 4) so that all of them together pass all of the RD_B[17:0] signals to RDATA_B[17:0] or all of them together pass all of the plurality of flip-flops 406 output signals to RDATA_B[17:0]. This configuration with plurality of multiplexers 408 makes the plurality of flip-flops 406 programmably bypassable as specified by the end user, since signals in the RD_B bus can be programmed to pass directly to the read data output terminals in the RDATA_B bus bypassing the flip-flops 406 or programmed to be held at the flip-flops 406 until the next active edge of RCLK_B.

The pluralities of flip-flops 402 and 406 and multiplexers 404 and 408 to RAM circuit block 400 programmably allow the presence or absence of a pipeline register after the RAM circuit block 400 as specified by the end user design. Thus the end user has the option of registering the read data immediately after performing a memory read by either port A 214 or port B 216 or both, or performing additional logic operations on it before registering it. This provides the end user with a higher degree of flexibility in optimizing the critical paths leading into and out of the register file in his soft processor. In synchronous mode, RA_A[8:0] and RA_B[8:0] must make setup and hold time relative to the active edges of RCLK_A and RCLK_B respectively.

The REN_A and REN_B signals are used to enable the pluralities of flip-flops 402 and 406 respectively. REN_A and REN_B must make setup and hold time relative to the active edge of RCLK_A and RCLK_B respectively. When either enable is asserted, its associated flip-flops will allow the data presented on the data inputs to be transmitted to the data outputs on the rising edge of the associated clock. When either enable is deasserted, its associated flip-flops will not allow data presented on the data inputs to be transmitted to the data outputs on the rising edge of the associated clock and will hold the previously stored data instead. Pluralities of flip-flops 302 and 402 can be programmably used in any combination: both used, neither used, or either one used without the other as specified by the end user. Similarly, pluralities of flip-flops 306 and 406 can be programmably used in any combination: both used, neither used, or either one used without the other as specified by the end user.

Writeable port C 218 behaves the same in RAM circuit block 400 as it did in RAM circuit blocks 200 and 300 of FIG. 2 and FIG. 3 respectively.

Other modifications to readable port A and readable port B of RAM circuit block 400 will suggest themselves to persons of ordinary skill in the art. For example, the functionality of the pluralities of flip-flops 302, 306, 402 and 406 could be modified to match that of any of a number of flip-flops known in the art by removing the enable inputs, adding either an asynchronous set or reset inputs, adding either a synchronous set or reset inputs, etc. Or the flip-flops can be programmed to be either a latch or a flip-flop as is often done with FPGA flip-flop logic modules known in the art. Or the pluralities of flip-flops in a port may have a completely different set of clock or enable signals or be programmed to operate in different modes. In other words, port A could have a new RCLK1_A signal and a new REN1_A signal coupled to the clock and enable inputs respectively of the flip-flops of the plurality of flip-flops 302 and a new RCLK2_A signal and a new REN2_A signal coupled to the clock and enable inputs respectively of the flip-flops of the plurality of flip-flops 402 replacing the old RCLK_A and REN_A signals (allowing for separate control of the two pluralities of flip-flops), and a similar modification could be made to port B. These and other such changes are within the scope of the present invention.

Figure 5:
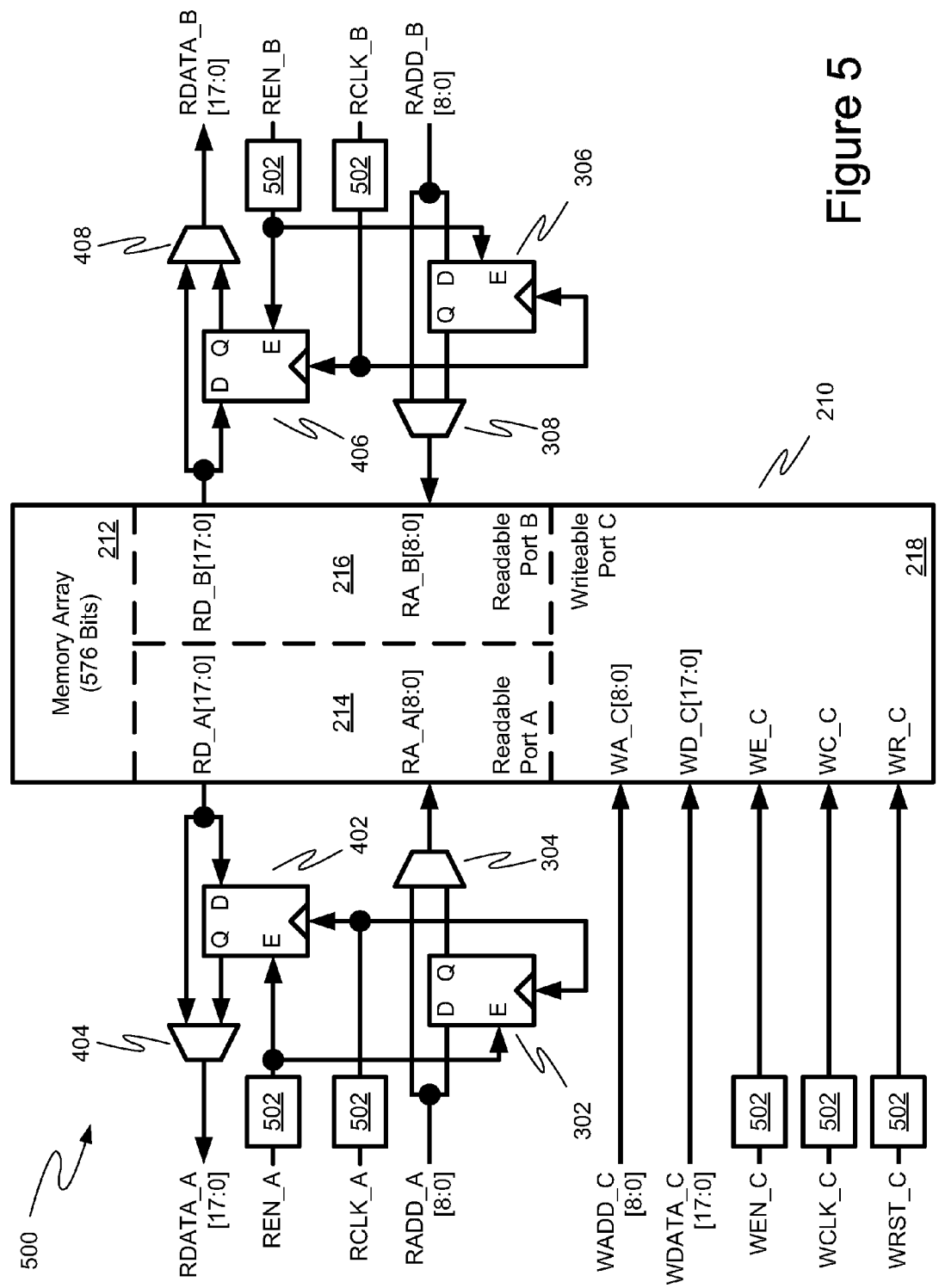
FIG. 5 is a block diagram showing a fourth exemplary random access memory circuit block according to the present invention.

FIG. 5 shows a fourth RAM circuit block 500 and its associated terminals according to the present invention. Present in FIG. 5 are three port RAM circuit block 210, pluralities of flip-flops 302, 306, 402 and 406, pluralities of multiplexers 304, 308, 404 and 408, and external terminals RDATA_A[17:0], RADD_A[8:0], REN_A, RCLK_A, RDATA_B[17:0], RADD_B[8:0], REN_B, RCLK_B, WADD_C[8:0], WDATA_C[17:0], WEN_C, WCLK_C and WRST_C previously discussed in conjunction with FIG. 2, FIG. 3, and FIG. 4. Also present are a number of programmable polarity circuits 502.

The RAM circuit block 500 behaves identically to RAM circuit block 400 of FIG. 4 except for the action of the programmable polarity circuits 502. In FIG. 5, programmable polarity circuits 502 are coupled in series with RAM circuit block 500 control input terminals REN_A, RCLK_A, REN_B, RCLK_B, WEN_C, WCLK_C and WRST_C. While preferably disposed only on control inputs to conserve area, in some embodiments they may be present on all input terminals as a matter of design choice. For example, clock signals are often distributed to a great many destinations internal to an FPGA and it is not uncommon for some of the destination circuits to respond to the rising edge of the clock while other destination circuits respond to the falling edge of the clock. Thus while RAM circuit block 210 is constructed with WC_C to be responsive to rising edges, the presence of programmable polarity circuit coupled between the WCLK_C control input terminal of RAM circuit block 500 and control input terminal WC_C of RAM circuit block 210 allows RAM circuit block 500 to be responsive to either the rising or falling edge of the signal on WCLK_C as specified by the end user.

Programmable polarity circuit 502 can be implemented by any of a number of circuits known in the art. For example, in the case of WCLK_C described above, programmable polarity circuit 502 can comprise a 2-input XOR gate and a 0/1 control element. WCLK_C and the 0/1 control element output are coupled to the inputs of the XOR gate and WC_C is coupled to the output. Thus when the control element is programmed to output a logic-0, WCLK_C will be passed to WC_C without any logic inversion, while when the control element is programmed to output a logic-1, an inverted version of WCLK_C will be passed to WC_C.

Figure 6:
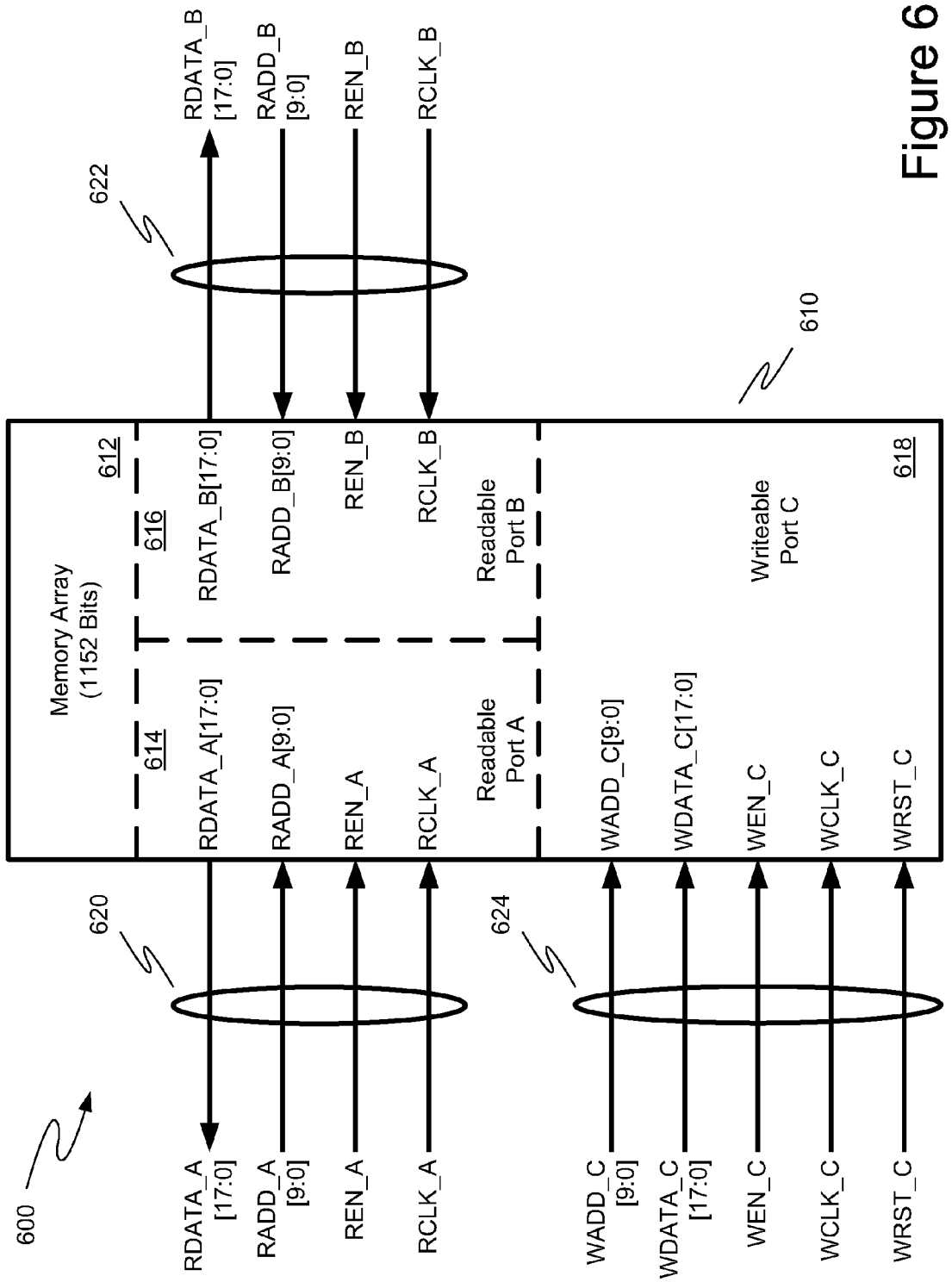
FIG. 6 is a block diagram showing a fifth exemplary random access memory circuit block according to the present invention.

FIG. 6 shows a fifth RAM circuit block 600 according to the present invention. Present in FIG. 6 is 1,152-bit three port RAM circuit block 610 and three sets of wires 620, 622 and 624 coupling the internal terminals of the three ports of RAM circuit block 610 to the external terminals of the three ports of RAM circuit block 600. RAM circuit block 610 has a memory array 612, a first readable port A 614, a second readable port B 616, and a writeable port 618.

The behavior of RAM circuit block 610 and RAM circuit block 500 of FIG. 5 is nearly identical, except that RAM circuit block 610 has twice as many bits (1,152 instead of 576), supports different depth and width modes as a consequence (64×18, 128×9, 256×4, 512×2 and 1K×1 instead of 32×18, 64×9, 128×4, 256×2 and 512×1), and each address bus has an extra address terminal (RADD_A[9:0], RADD_B [9:0], and WADD_C[9:0] instead of RADD_A[8:0], RADD_B[8:0], and WADD_C[8:0]). Except for the differing numbers of indices, all of the terminals of RAM circuit blocks 600 and 610 have identical functionality to the similarly named terminals of RAM circuit block 500.

FIG. 6 illustrates the logarithmic relationship between the number of bits in a memory and the number of address signals necessary to address them. As long as the supported word widths do not change, only one signal needs to be added to each address bus to address the additional data. This is an important consideration for interfacing a RAM memory block to the surrounding FPGA array since a lot of memory capacity can be added in many embodiments with very little effect on the interface.

Figure 7:
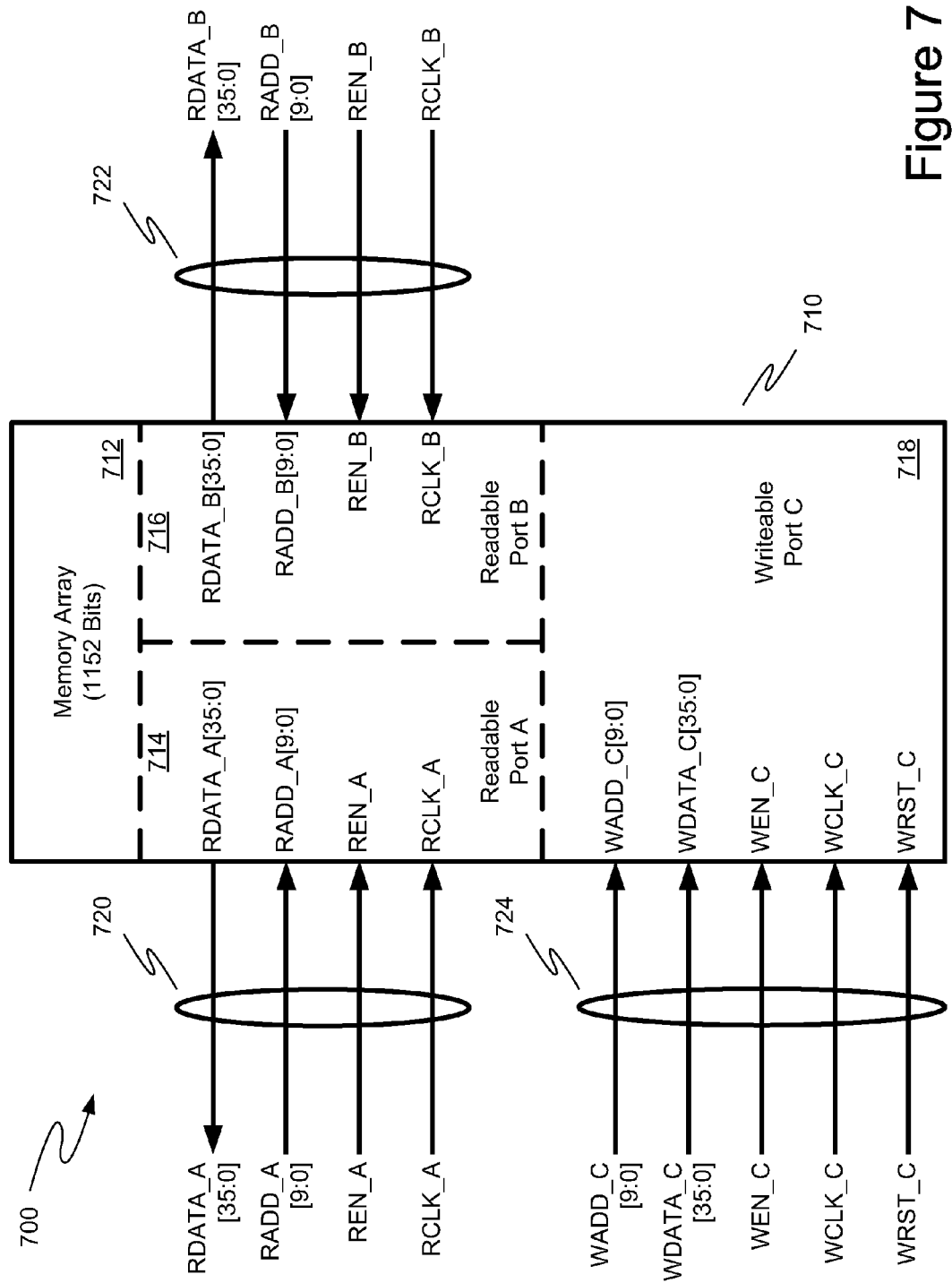
FIG. 7 is a block diagram showing a sixth exemplary random access memory circuit block according to the present invention.

FIG. 7 shows a fifth RAM circuit block 700 according to the present invention. Present in FIG. 7 is 1,152-bit three port RAM circuit block 710 and three sets of wires 720, 722 and 724 coupling the internal terminals of the three ports of RAM circuit block 710 to the external terminals of the three ports of RAM circuit block 700. RAM circuit block 710 has a memory array 712, a first readable port A 714, a second readable port B 716, and a writeable port 718.

The behavior of RAM circuit block 710 and RAM circuit block 500 of FIG. 5 is nearly identical, except that RAM circuit block 710 has twice as many bits (1,152 instead of 576), supports different depth and width modes (32×36, 64×18, 128×9, 256×4, 512×2 and 1K×1 instead of 32×18, 64×9, 128×4, 256×2 and 512×1), each address bus has an extra terminal (RADD_A[9:0], RADD_B[9:0], and WADD_C[9:0] instead of RADD_A[8:0], RADD_B[8:0], and WADD_C[8:0]), and each data bus has 18 extra data terminals (RDATA_A[35:0], RDATA_B[35:0], and WDATA_C[35:0] instead of RDATA_A[17:0], RDATA_B [17:0], and WDATA_C[17:0]). Except for the differing numbers of indices, all of the terminals of RAM circuit blocks 700 and 710 have identical functionality to the similarly named terminals of RAM circuit block 500.

FIG. 7 illustrates the linear relationship between the number of bits in a data word and the number of data inputs and data outputs necessary to access them. When the supported word widths change, the number of terminals on the RAM circuit block can change dramatically. This is an important consideration for both specifying a RAM circuit block for use in an FPGA array as well as for interfacing it to the surrounding FPGA array.

Figure 8A:
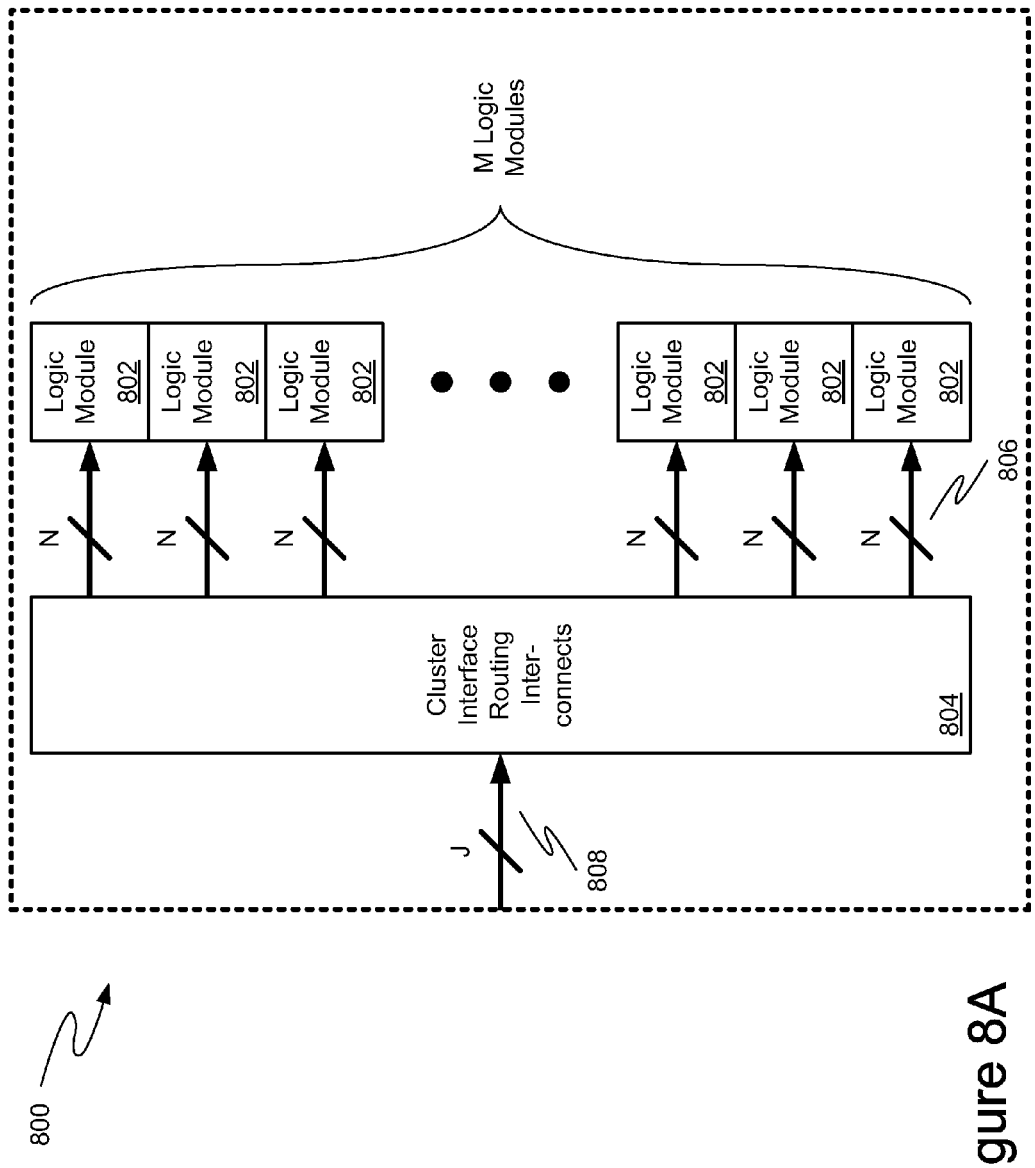
FIG. 8A is a block diagram showing a logic cluster suitable for use with the present invention.

FIG. 8A shows a logic cluster of a type suitable for use with RAM circuit blocks of the present invention. Cluster 800 comprises a number (assigned the variable name M) of logic modules 802. Any number of logic modules may be present in cluster 800 as a matter of design choice. The logic modules may be of any type known in the art and have a number of inputs (assigned the variable name N) appropriate for the logic module 802 chosen.

Also present in FIG. 8A is logic cluster interface circuit 804. This is a circuit comprising routing interconnect programmable elements such as wires, buffers, multiplexers, switches, etc. which is appropriate for the logic module 802 and the control elements used in the FPGA. Busses of wires 806 couple output terminals of logic cluster interface circuit 804 to the input terminals of the logic modules 802. Each bus 806 is N wires wide in FIG. 8A where the value of N is a matter of design choice. A number (assigned the variable name J) of horizontal and vertical routing interconnects 808 of the FPGA couple to input terminals of logic cluster interface circuit 804. The number J chosen is a matter of design choice. Typically in a clustered architecture M×N>J in order to reduce the area devoted to the logic cluster interface circuit 804. This means that fewer signals can enter the cluster than the total number of inputs of all the logic modules 802 combined. This limitation is a significant factor in memory block interfacing through a logic cluster-like interface.

Persons of ordinary skill in the art will appreciate that logic cluster 800 is extremely simplified and many details have been omitted. For example, each of the logic modules has at least one output (not shown in FIG. 8A) which may be coupled to input terminals of cluster interface 804 that may in turn be routed to the FPGA routing interconnects though output terminals of cluster interface 804 (also not shown in FIG. 8A). Because memories suitable for use as register files like RAM circuit blocks 200, 300, 400, 500, 600 and 700 typically have significantly more inputs than outputs, the interfacing issues occur primarily with respect to the inputs. Thus in the subsequent drawing figures and the associated descriptions, there is no illustration or mention of the RAM circuit block output terminals to avoid unnecessary details and obscuring the inventive aspects herein disclosed.

Figure 8B:
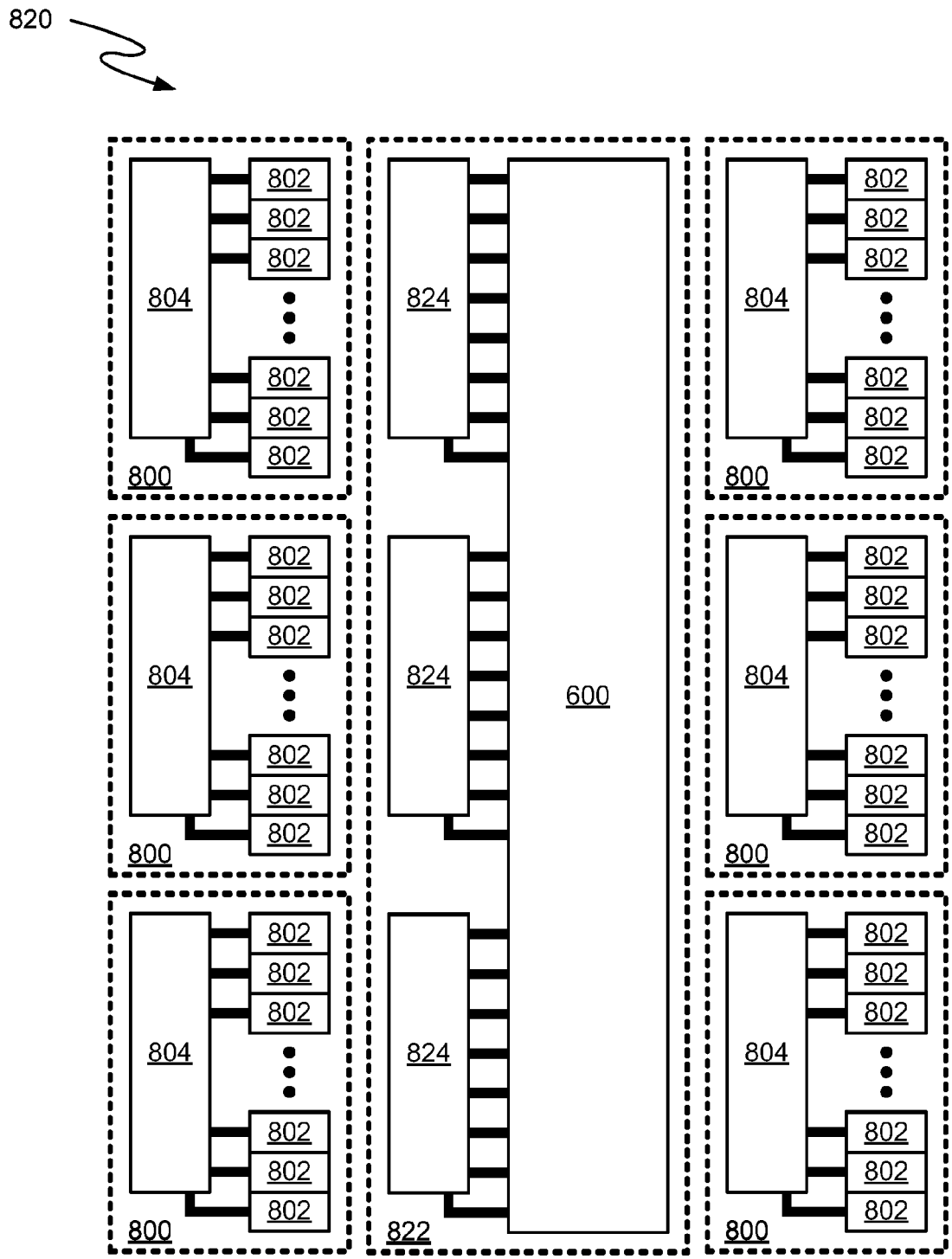
FIG. 8B is a block diagram showing a programmable array of logic clusters including an instance of the fifth exemplary random access memory circuit block according to the present invention.

FIG. 8B shows an exemplary portion 820 of an FPGA array including an instance of RAM circuit block 600 according to the present invention. Present in FIG. 8B are six instances of logic cluster 800 of FIG. 8A with the logic modules 802 and logic cluster interface circuits 804 shown. Also present is one instance of macro block 822 which comprises one instance of RAM circuit block 600 and three RAM cluster interface circuits 824. RAM cluster interface circuit 824 is preferably identical or very similar to logic cluster interface circuit 804, though a different design may be used.

In this embodiment, RAM circuit block 600 is physically laid out to be the same height as three logic clusters 800 so three RAM cluster interface circuits 824 are present. Not shown in FIG. 8B are horizontal and vertical FPGA routing interconnects which are used to transport signals from one cluster interface circuit to another of either type (804 or 824). Also not shown in FIG. 8B are any RAM circuit block 600 output connections to the RAM cluster interface circuits 824 in the macro block 822.

Figure 8C:
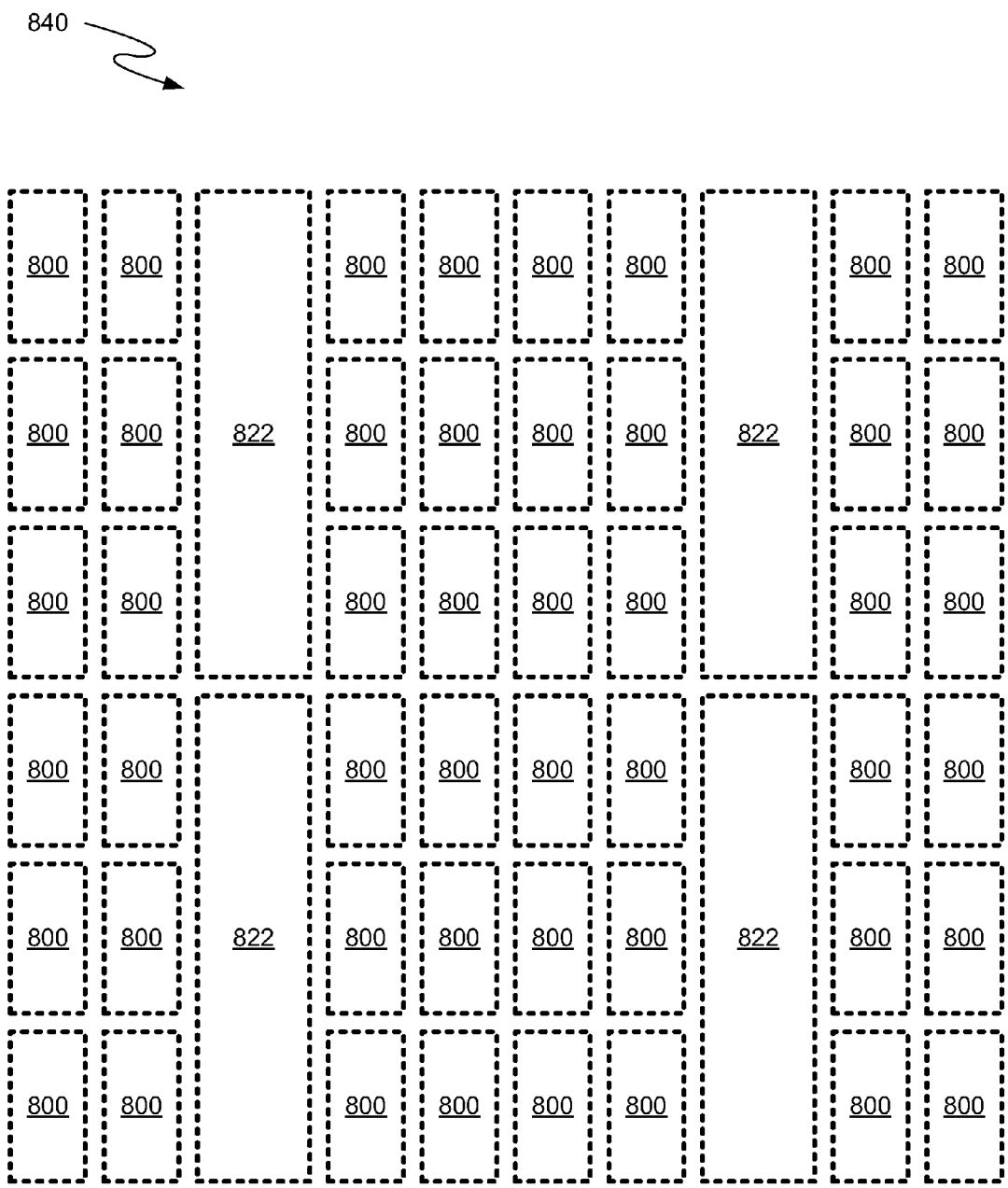
FIG. 8C is a block diagram showing a larger programmable array of logic clusters including two rows of instances of the fifth exemplary random access memory circuit block according to the present invention.

FIG. 8C shows an exemplary portion of an FPGA array 840. In FPGA array 840, the logic clusters are laid out in rows and columns. While six rows and eight columns are shown in FIG. 8C, any number may be present as a matter of design choice. Also present in the array are two columns of macro blocks 822, though any number may be present as a matter of design choice.

In the exemplary embodiment of the invention illustrated in FIG. 8B and FIG. 8C, it is assumed that J=23. Thus the three RAM interface circuits 824 present in each macro block 822 provide a total of 3×23=69 inputs which provides adequate interconnectivity since RAM circuit block 600 is shown with 55 inputs in FIG. 6.

Figure 8D:
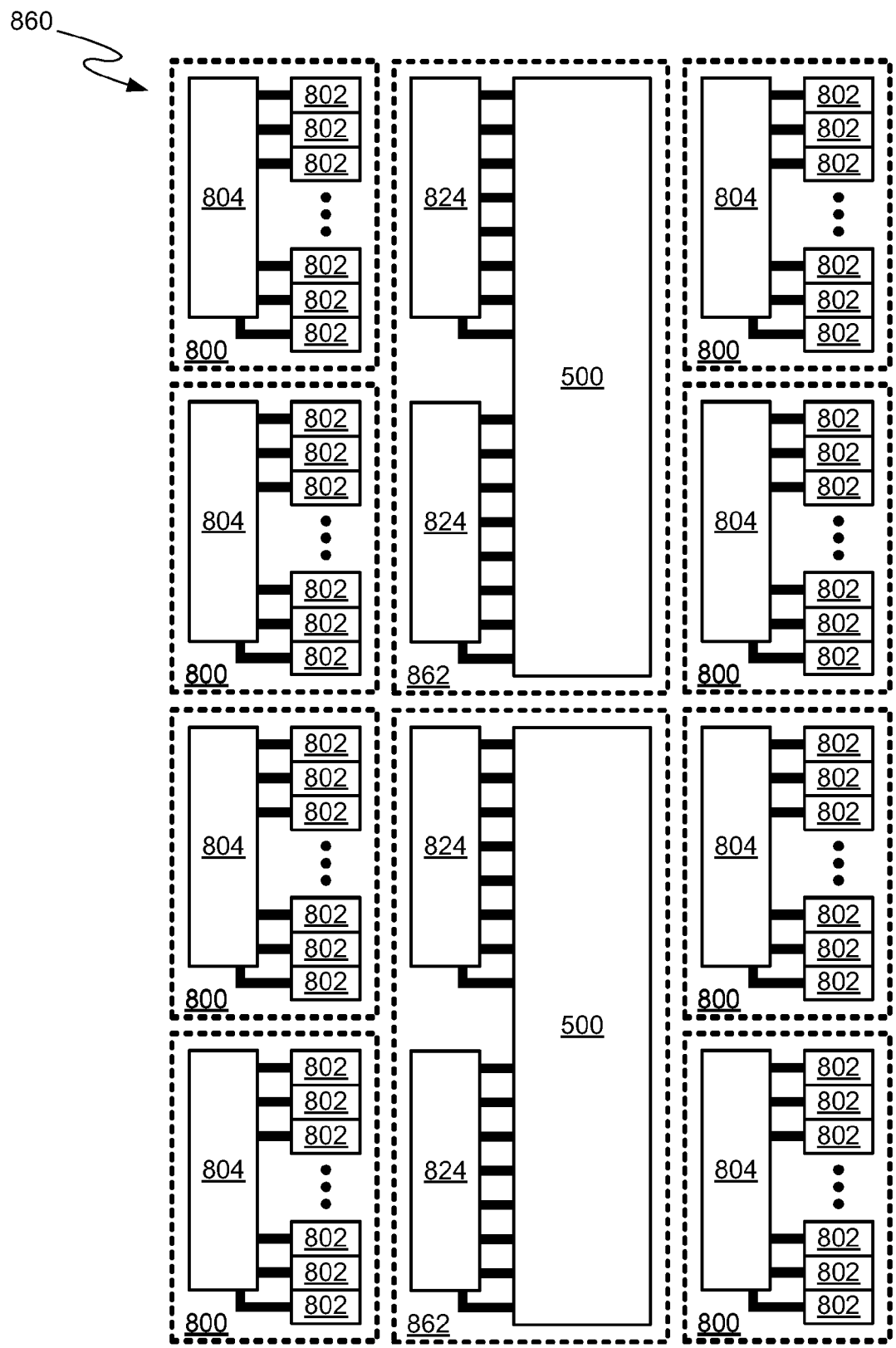
FIG. 8D is a block diagram showing a programmable array of logic clusters including two instances of the fourth exemplary random access memory circuit block according to the present invention.

FIG. 8D shows an exemplary portion of an FPGA array 860 including two instances of RAM circuit block 500 according to the present invention. Present in FIG. 8D are eight instances of logic cluster 800 of FIG. 8A with the logic modules 802 and logic cluster interface circuits 804 shown. Also present are four instances of macro block 862 which comprises one instance of RAM circuit block 500 and two RAM cluster interface circuits 824. RAM cluster interface circuit 824 is preferably identical or very similar to logic cluster interface circuit 804, though a different design may be used.

In this embodiment, RAM circuit block 500 (which has half of the memory bits of RAM circuit block 600 and is thus significantly smaller) is physically laid out to be the same height as two logic clusters 800 so two RAM cluster interface circuits 824 are present in each macro block 862. Not shown in FIG. 8D are horizontal and vertical FPGA routing interconnects which are used to transport signals from one cluster interface circuit to another of either type (804 or 824). Also not shown are any RAM circuit block 500 output connections to the RAM cluster interface circuits 824 in the macro block 862.

Figure 8E:
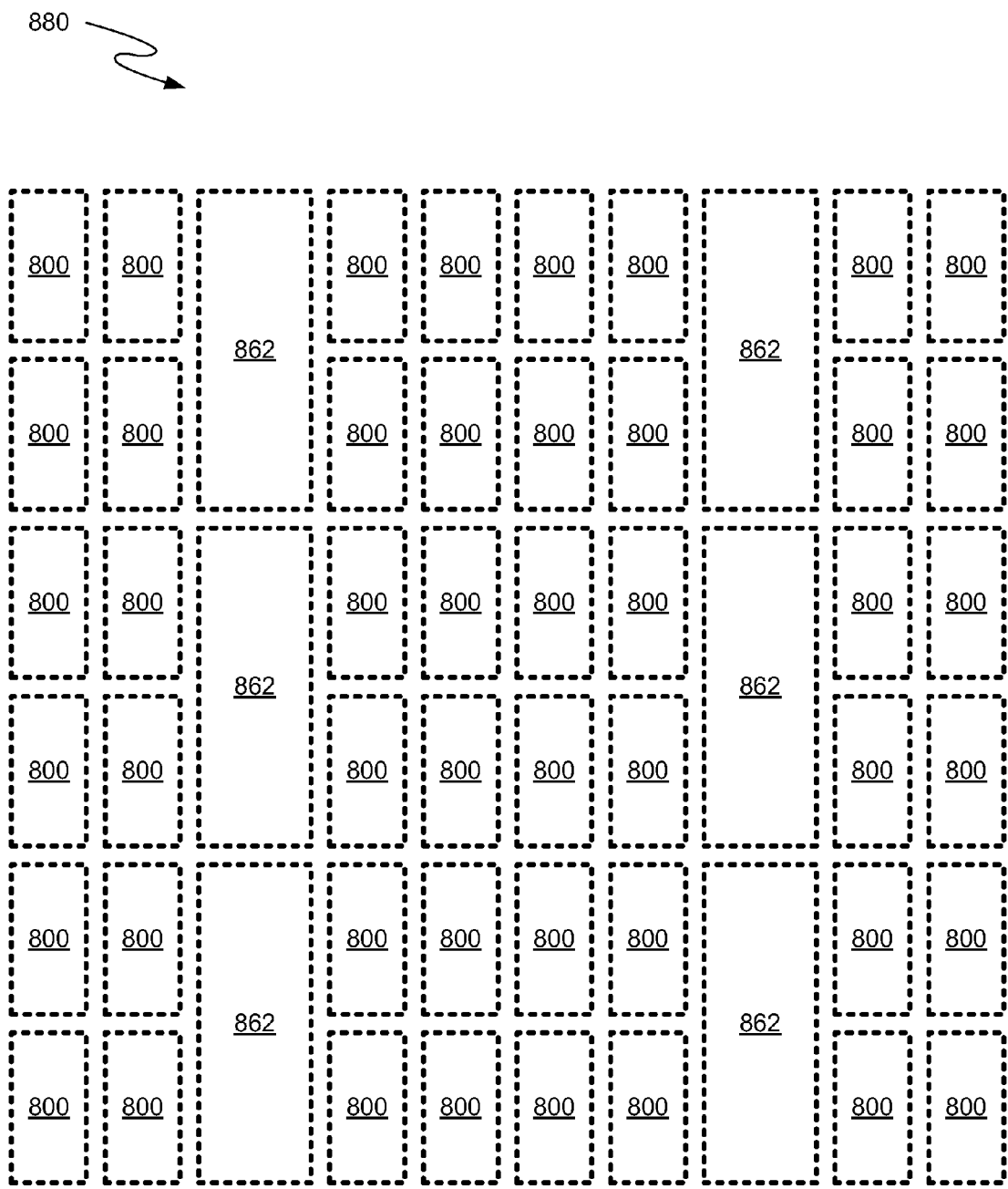
FIG. 8E is a block diagram showing a larger programmable array of logic clusters including two rows of instances of the fourth exemplary random access memory circuit block according to the present invention.

FIG. 8E shows an exemplary portion of an FPGA array 880. In FPGA array 880, the logic clusters 800 are laid out in rows and columns. While six rows and eight columns are shown in FIG. 8C, any number may be present as a matter of design choice. Also present in the array are two columns of macro blocks 862, though any number may be present as a matter of design choice.

In the exemplary embodiment of the invention illustrated in FIG. 8D and FIG. 8E, it is assumed that J=23. Thus the two RAM interface circuits 824 present in each macro block 862 provide a total of 2×23=46 inputs. This requires using special interconnect techniques according to the present invention, since RAM circuit block 500 is shown with 52 routable inputs in FIG. 5.

Figure 9A:
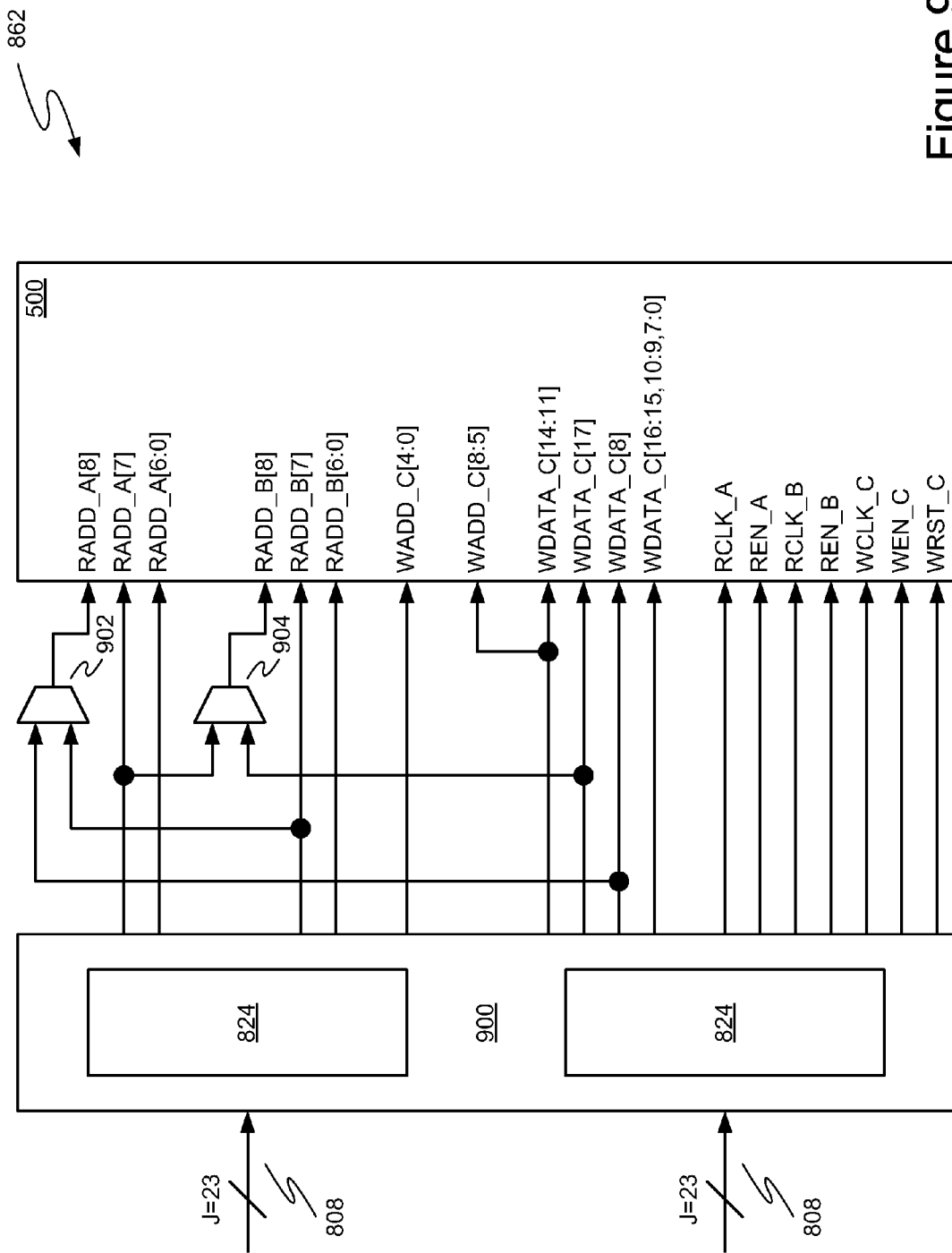
FIG. 9A is a block diagram showing interconnection details of an instance of the fourth exemplary random access memory circuit block according to the present invention.

FIG. 9A shows macro block 862 in additional detail. Present in FIG. 9A are RAM circuit block 500, two instances of RAM cluster interface circuit 824, and two busses of external horizontal and vertical interconnects 808 (with J=23 in each case) all previously discussed.

Also present in FIG. 9A is interconnect boundary 900. Interconnect boundary 900 is an abstraction surrounding the two RAM cluster interface circuits 824. One important aspect of FIG. 9A is that two RAM cluster interface circuits 824 can couple at most 46 signals from busses 808 to RAM circuit block 500. Thus for purposes of this discussion, at most 46 signals may enter interconnect boundary 900 from the FPGA horizontal and vertical routing interconnects from busses 808 and at most 46 signals may exit interconnect boundary 900 and couple to RAM circuit block 500. The details of which RAM cluster interface block 824 that any particular input terminal to RAM circuit block 500 couples to would greatly complicate the diagram, since in a practically realizable design the choices would be made based upon the particular details of the physical layout of RAM circuit block 500, the overall routing interconnect architecture, and the circuit details of the two RAM cluster interface blocks 824. Thus in FIG. 9A, the signals on RAM circuit block 500 are ordered with respect to logical functionality. This will facilitate understanding of the inventive interface techniques presented without cluttering the drawing figure with unnecessary details.

Since RAM circuit block 500 has 52 input terminals of which only 46 may be used at any given time, it follows that either some of the 52 inputs must share or that some port operating modes or combinations of port operating modes by not be used. One useful observation is that when the writeable port C is operating at its maximum word width (32×18) that only five of the nine address terminals are being used. A second useful observation is that when operating in the next widest mode (64×9), nine of the eighteen write data input terminals are unused (the nine most significant bits WDATA_C[17:9] being inactive). Thus there is no reason four of the write data terminals cannot double as write address input terminals. Thus in FIG. 9A input terminals WADD_C[8:5] are coupled to input terminals WDATA_C[14:11] in addition to being coupled interface boundary 900.

Also present in FIG. 9A are two multiplexers 902 and 904. Multiplexer 902 has a data output coupled to input terminal RADD_A[8] on RAM circuit block 500, a first data input coupled to interconnect boundary 900 and the input terminal RADD_B[7] of RAM circuit block 500, and a second data input coupled to interconnect boundary 900 and the input terminal WDATA_C[8] of RAM circuit block 500. Multiplexer 904 has a data output coupled to input terminal RADD_B[8] on RAM circuit block 500, a first data input coupled to interconnect boundary 900 and the input terminal RADD_A[7] of RAM circuit block 500, and a second data input coupled to interconnect boundary 900 and the input terminal WDATA_C[17] of RAM circuit block 500.

All of the other terminals on RAM circuit block 500 are coupled to interconnect boundary 900 by a single wire (or bus of wires). In the notation for bus terminal WDATA_C[16:15, 10:9, 7:0], the colon signals a range of indices while the comma acts as a separator. In this case, the signals corresponding to the indices i=16, 15, 10, 9, 7, 6, 5, 4, 3, 2, 1, 0 of the WDATA_C[i] bus are present in the associated terminals and bus of wires. These connections shown in FIG. 9A make up for the apparent lack of six wires crossing interconnect boundary 900, though the place and route circuitry must treat SRAM circuit block 500 differently in different configurations corresponding to Cases 1, 2 and 3 described in conjunction with FIG. 9B, 9C and 9D below.

A third useful observation is that if the 9$^{th}$ bit in each byte in the ×9 and ×18 modes is not used (making them effectively ×8 and ×16 modes respectively), then terminals WDATA_C[17] and WDATA_C[8] are unused, thus reducing the number of signals that must cross interconnect boundary 900 by two. Thus by WADD_C[8:5] and WDATA_C[14:11] sharing four interconnects and WDATA_C[17] and WDATA_C[8] not requiring their interconnects, RAM circuit block 500 can be completely serviced by the 46 signals crossing interconnect boundary 900 with no restrictions on simultaneous use of modes by the various ports. This is illustrated in more detail in FIG. 9B which is identical to FIG. 9A except for reference numbers 906 and 908 the dashed lines they indicate.

Figure 9B:
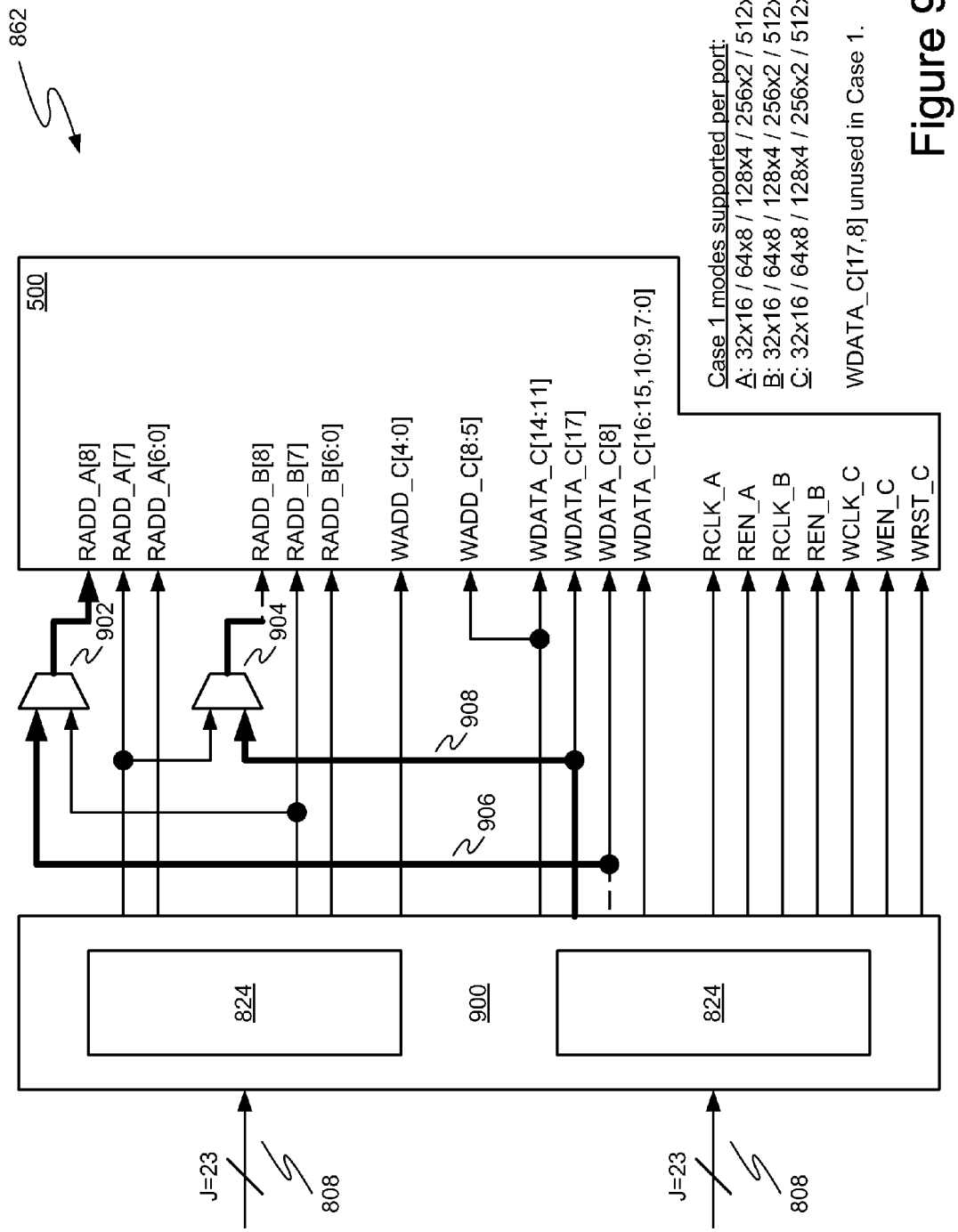
FIG. 9B is a block diagram showing interconnection details of an instance of the fourth exemplary random access memory circuit block according to the present invention.

FIG. 9B illustrates Case 1, where no 9$^{th}$ bits are used and each port may be freely organized as 32×16, 64×8, 128×4, 256×2 and 512×1 without respect to the organization of the other ports. In Case 1, WDATA_C[17] and WDATA_C[8] are unused. Dashed line 906 shows the signal path taken from interconnect boundary 900 through multiplexer 902 to input terminal RAD_A[8] of RAM circuit block 500, and dashed line 908 shows the signal path taken from interconnect boundary 900 through multiplexer 904 to input terminal RAD_B[8] of RAM circuit block 500. The operation of Case 1 is summarized in the legend at the lower right of FIG. 9B.

For many applications, being limited to ×8 and ×16 words in the wider modes is perfectly adequate. However in other applications the 9$^{th}$ bit is needed as a parity bit, a telecommunication flag, or for some other use, preferably without the need to impose mode restrictions on the end user.

A fourth useful observation is that if WDATA_C[17,8] are in use for writing 9-bit bytes, then at least one of the readable ports must be programmed into either 32×18 or 64×9 mode. If readable port A is in one of the 128×4, 256×2 or 512×1 modes and if readable port B is also in one of the 128×4, 256×2 or 512×1, then there is no reason to be writing 9-bit bytes, since the 9$^{th}$ bit will never be read. However, if a readable port is in 32×18 or 64×9, then at most six of the nine address terminals for that port will not be used, leaving three of those address lines free for alternate use. Exploiting this fourth observation is another purpose of multiplexers 902 and 904.

Figure 9C:
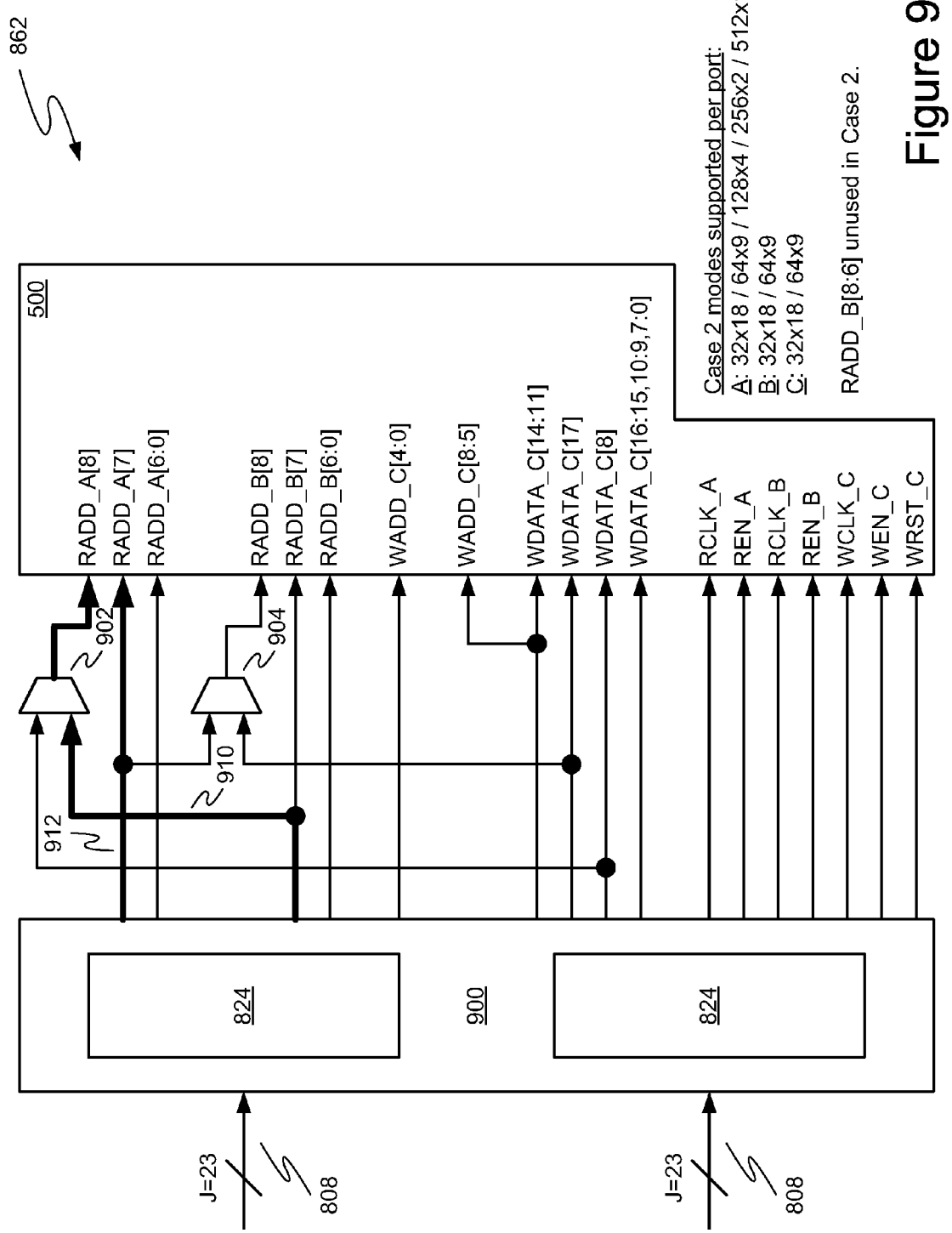
FIG. 9C is a block diagram showing interconnection details of an instance of the fourth exemplary random access memory circuit block according to the present invention.

FIG. 9C illustrates Case 2, where readable port B is in either 32×18 or 64×9 mode, writeable port C is in either 32×18 or 64×9 mode, and readable port A may be freely organized as 32×18, 64×9, 128×4, 256×2 and 512×1 without respect to the organization of the other ports. In Case 2, WDATA_C[17] and WDATA_C[8] are used and RADD_B[8:6] are unused. This is summarized in the legend at the lower right of the drawing figure. FIG. 9C is identical to FIG. 9A except for the legend and reference numbers 910 and 912 the dashed lines they indicate.

In FIG. 9C, the dashed line 910 shows that the wire from interconnect boundary 900 coupled to RADD_B[7] and multiplexer 902 is used to provide the readable port A most significant address bit RADD_A[8] through multiplexer 902. Similarly, the dashed line 912 coupled to interconnect boundary 900, RADD_A[7] and multiplexer 904 is used to provide RADD_A[7] since RADD_B[8] and multiplexer 904 are unused in Case 2.

Figure 9D:
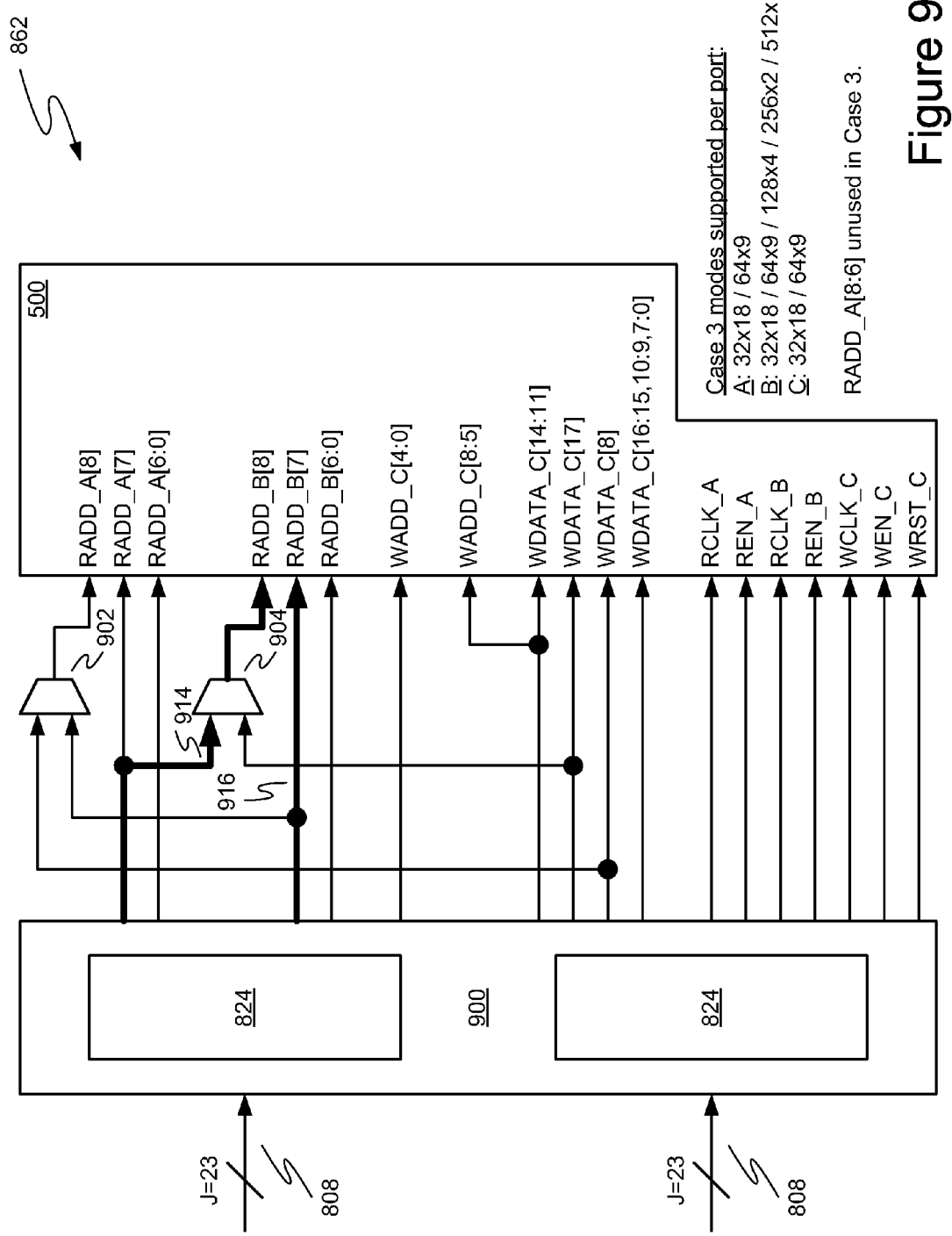
FIG. 9D is a block diagram showing interconnection details of an instance of the fourth exemplary random access memory circuit block according to the present invention.

FIG. 9D illustrates Case 3, where readable port A is in either 32×18 or 64×9 mode, writeable port C is in either 32×18 or 64×9 mode, and readable port A may be freely organized as 32×18, 64×9, 128×4, 256×2 and 512×1 without respect to the organization of the other ports. In Case 3, WDATA_C[17] and WDATA_C[8] are used and RADD_A[8:6] are unused. This is summarized in the legend at the lower right of the diagram. FIG. 9D is identical to FIG. 9A except for the legend and reference numbers 914 and 916 the dashed lines they indicate.

In FIG. 9D, the dashed line 914 shows that the wire from interconnect boundary coupled to RADD_A[7] and multiplexer 904 is used to provide the readable port B most significant address bit RADD_B[8] through multiplexer 904. Similarly, the dashed line 916 coupled to interconnect boundary 900, RADD_B[7] and multiplexer 902 is used to provide RADD_B[7] since RADD_A[8] and multiplexer 902 are unused in Case 3.

Case 2 and Case 3 are logically identical since port A and readable port B are swappable in FIGS. 9A through 9D. One of the multiplexers could be removed to save a small amount of area. If it were multiplexer 904, then Case 3 would not be available. Making them both available is preferable in some embodiments as it allows the place and route tool in the design software the additional flexibility of swapping port A and port B in a manner transparent to the end user when it is advantageous.

Cases 1, 2 and 3 exploit various aspects of the specific illustrative embodiment discussed in FIGS. 8D through 9D, however the general principles employed can be used to solve many similar FPGA memory interface problems. For example, in any writeable port that has multiple depth and width modes, some of the higher order write data input terminals can share a routing interconnect with some of the write address terminals. Or a write data input terminal used for parity bits or some other function can share a routing interconnect with an address terminal either directly or through a multiplexer. Or address terminals of two different read ports can be shared between the ports either directly or through a multiplexer.

As will be appreciated by someone of ordinary skill in the art, the embodiments and interconnect methods described in conjunction with FIGS. 8A through 9D have been very abstract. Many details present in a practical FPGA implementation of the present invention have been omitted for the sake of clarity of presentation. Thus the embodiments described should be considered to be illustrative of the inventive principles and not limiting in any way.

The design software provided by the PLD manufacturer will provide various methods for the end user to utilize the three port RAM circuit blocks of the present invention. One or more symbols may be provided for schematic entry, or an analogous portion of code may be provide for use in the hardware description languages (HDL) supported, or in some cased both may be provided. In some embodiments multiple symbols may be provided. For example, Cases 1, 2 and 3 of FIGS. 9B, 9C and 9D respectively might each have a different symbol or analogous HDL code available to the end user. These symbols and portions of HDL code are the virtual programmable elements corresponding to the three port RAM circuit block physical programmable elements present in the FPGA hardware. In some cases, the end user will write HDL code that abstractly describes the sort of three ported RAM circuit blocks of the present invention, in which case the design software is able to infer the correspondence between the user's HDL code and the virtual programmable elements corresponding to the three port RAM circuit blocks.

When the design is complete, the design software then takes it and converts it into the appropriate mix of virtual programmable elements, searches the design for special blocks like the three port RAM blocks of the present invention, maps them into corresponding physical programmable elements inside the FPGA, virtually configures the interconnect-type programmable elements to route the signals from one logic-type programmable element to another, and generates the data structure necessary to assign values to the various physical control elements inside the FPGA. The searching and identifying of the special blocks including the RAM circuit blocks may be done before, after, or simultaneously with the converting of the rest of the design to virtual programmable elements. If a programming fixture is physically present on the design system, the data structure may be directly applied to program an FPGA. Alternatively, the data structure may be ported in a computer-readable medium to a dedicated programming system or into the end user's system for programming the FPGA at a later time.

The three port RAM circuit blocks of the present invention may be used alone within an FPGA array, or they may be used in combination with other types of RAM circuit blocks. In particular, combining one or more relatively small three port RAM circuit blocks with one or more larger single port, two port, or dual port RAM circuit blocks is highly desirable since such a combination allows the FPGA array to efficiently implement complementary functions. For example, smaller three port RAM circuit blocks could be used to implement the register files in one or more soft processors while one or more larger RAM circuit blocks could be used for functions like scratch pad memories, program or data storage memories, and cache memories, etc., for the soft processors.

In various embodiments of the present invention, alternate methods of accessing the memory bits of the RAM circuit blocks may be present for purposes of initialization after power up, programming, test, saving state to a non-volatile memory prior to entry into a low power mode, restoring state from a non-volatile memory after return from a low power mode, or possibly other purposes. Such alternate methods of access are not ports in the sense used in this application because the control signals applied to the RAM circuit block do not pass through the programmable routing interconnects of the FPGA array. For example, if the memory bits of the RAM circuit block also form a portion of the address space of the configuration memory of an SRAM-based memory array, that method of access is not a port in the sense used in this application. Similarly, if a test scheme places multiplexers on every input to allow manipulation of the RAM circuit block apart from the routing interconnects of the FPGA array, that method of access is not a port in the sense used in this application.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A field programmable gate array integrated circuit device comprising:
a programmable array having logic modules and routing interconnects programmably coupleable to the logic modules;
a random access memory circuit including first, second, and third ports, each of the first second, and third ports comprising a plurality of address input terminals each programmably coupleable to the routing interconnects;
wherein each of the first and second ports of the random access memory circuit is readable and asynchronous and further include a plurality of data output terminals each programmably coupleable to the routing interconnects; and
the third port of the random access memory circuit is synchronous, writeable, and further includes a plurality of data input terminals each programmably coupleable to the routing interconnects, wherein at least one external input terminal is shared by one address input and one data input.

2. The field programmable gate array integrated circuit device of claim 1, wherein at least one address or data input terminal is driven by either of two shared external input terminals through a multiplexer.

3. The field programmable gate array integrated circuit device of claim 1 further including at least one random access memory circuit including first and second ports, each of the first and second ports comprising a plurality of address input terminals each programmably coupleable to the routing interconnects.

4. A field programmable gate array integrated circuit device comprising:
a programmable array having logic modules and routing interconnects programmably coupleable to the logic modules;
a random access memory circuit including first and second ports, each of the first and second ports being readable and including a plurality of address input terminals each programmably coupleable to the routing interconnects and a plurality of data output terminals each programmably coupleable to the routing interconnects;
wherein at least one external input terminal is shared by one address input and one data input.

5. The field programmable gate array integrated circuit device of claim 4, wherein at least one address or data input terminal is driven by either of two shared external input terminals through a multiplexer.

* * * * *